(12) United States Patent
Ohara

(10) Patent No.: US 12,057,657 B2
(45) Date of Patent: Aug. 6, 2024

(54) ELECTRONIC APPARATUS WITH A BRACKET AS A PROTECTIVE MEMBER

(71) Applicant: Mitsubishi Electric Corporation, Tokyo (JP)

(72) Inventor: Takashi Ohara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 337 days.

(21) Appl. No.: 17/597,153

(22) PCT Filed: Sep. 4, 2019

(86) PCT No.: PCT/JP2019/034695
§ 371 (c)(1),
(2) Date: Dec. 28, 2021

(87) PCT Pub. No.: WO2021/044538
PCT Pub. Date: Mar. 11, 2021

(65) Prior Publication Data
US 2022/0320792 A1    Oct. 6, 2022

(51) Int. Cl.
*H01R 13/533*  (2006.01)
(52) U.S. Cl.
CPC ................... *H01R 13/533* (2013.01)
(58) Field of Classification Search
CPC .. H01R 13/66; H01R 13/665; H01R 13/6658; H01R 13/6608; H01R 13/6616;
(Continued)

(56) References Cited

U.S. PATENT DOCUMENTS 6,669,506 B2 * 12/2003 Newton ................ B60T 13/665
439/564
7,914,298 B2 * 3/2011 Lauermann ............ H02G 3/088
439/76.1
(Continued)

FOREIGN PATENT DOCUMENTS

JP    09-132049 A    5/1997
JP    2002-353675 A   12/2002
(Continued)

OTHER PUBLICATIONS

International Search Report for PCT/JP2019/034695 dated Nov. 19, 2019 [PCT/ISA/210].
(Continued)

*Primary Examiner* — Harshad C Patel
(74) *Attorney, Agent, or Firm* — Sughrue Mion, PLLC; Richard C. Turner

(57) ABSTRACT

There is provided an electric apparatus that can suppress the number of components from increasing and hence can suppress the production cost from rising, while providing a mechanism for covering a ventilation hole. The electric apparatus includes a case provided with a ventilation hole penetrating an outer wall, a protective member for covering outside of the ventilation hole, and one or both of a bracket for mounting the case to an external object and an external connector for electrically connecting an electronic component with outside; the protective member is a part of the bracket or a part of the external connector; a communication path for making the outer opening portion of the ventilation hole communicate with outside is provided between the outer wall and the protective member.

10 Claims, 17 Drawing Sheets

(58) Field of Classification Search
CPC ............ H01R 13/6625; H01R 13/6633; H01R 13/533; H01R 13/53
See application file for complete search history.

(56) References Cited

U.S. PATENT DOCUMENTS

| | | | | |
|---|---|---|---|---|
| 8,624,139 | B2* | 1/2014 | Huang | H01H 15/24 |
| | | | | 200/547 |
| 9,306,313 | B2* | 4/2016 | Heggemann | H01R 13/40 |
| 9,590,370 | B1* | 3/2017 | Lee | H05K 7/1492 |
| 10,085,360 | B2* | 9/2018 | Ju | G06F 1/203 |
| 10,186,813 | B2* | 1/2019 | Kawamura | H05K 5/0073 |
| 11,065,065 | B2* | 7/2021 | Rezach | A61B 17/7082 |
| 11,721,932 | B2* | 8/2023 | Rahm | H02G 3/083 |
| | | | | 439/583 |
| 11,855,384 | B2* | 12/2023 | Asano | H01R 13/5202 |
| 2010/0079021 | A1 | 4/2010 | Lorin | |
| 2012/0295469 | A1* | 11/2012 | Takeda | H01R 13/6658 |
| | | | | 439/377 |
| 2022/0200195 | A1* | 6/2022 | Asano | H01R 13/533 |

FOREIGN PATENT DOCUMENTS

| | | | |
|---|---|---|---|
| JP | 2006-523945 | A | 10/2006 |
| JP | 2015-050337 | A | 3/2015 |

OTHER PUBLICATIONS

Office Action issued Jun. 7, 2022 in Japanese Application No. 2021-543855.
Chinese Office Action dated Aug. 24, 2023 in Application No. 201980099833.9.

* cited by examiner

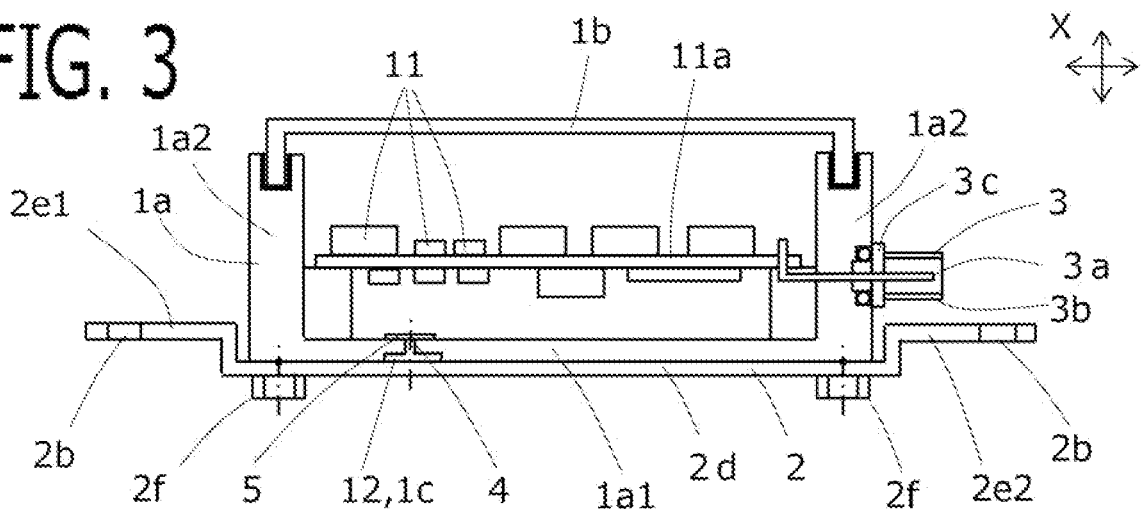
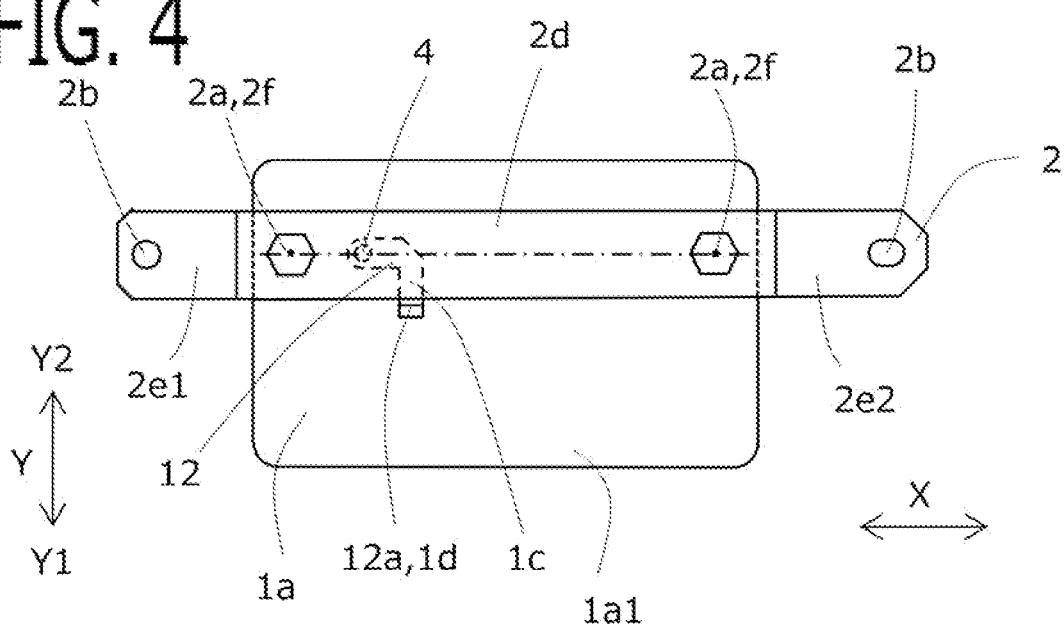

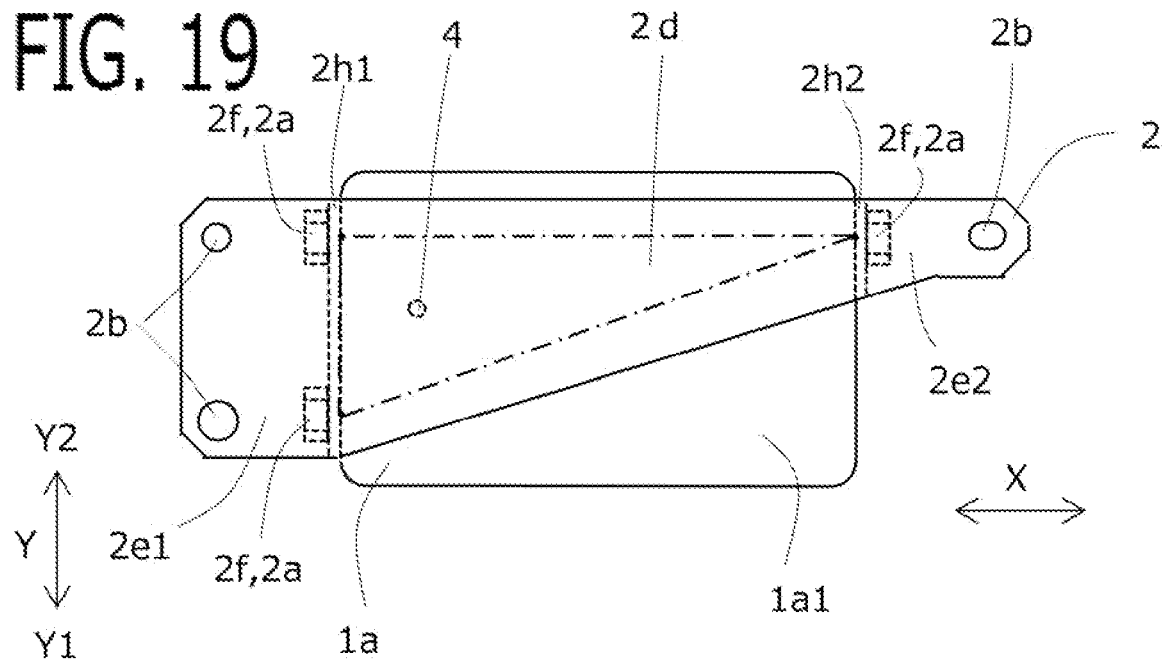
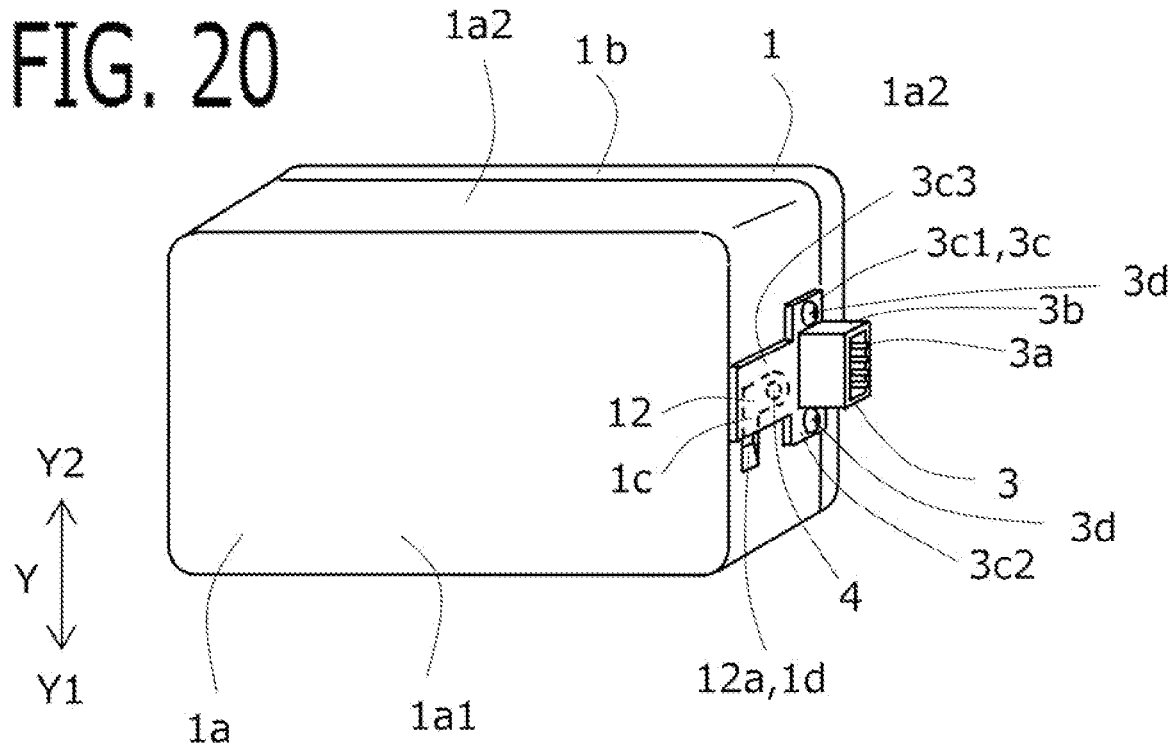

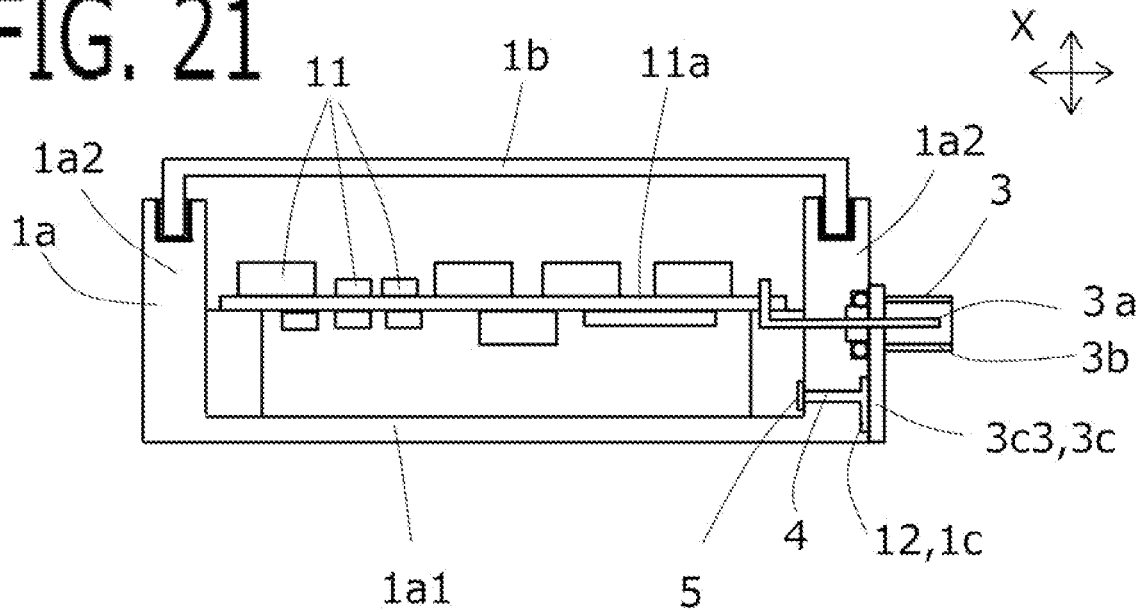
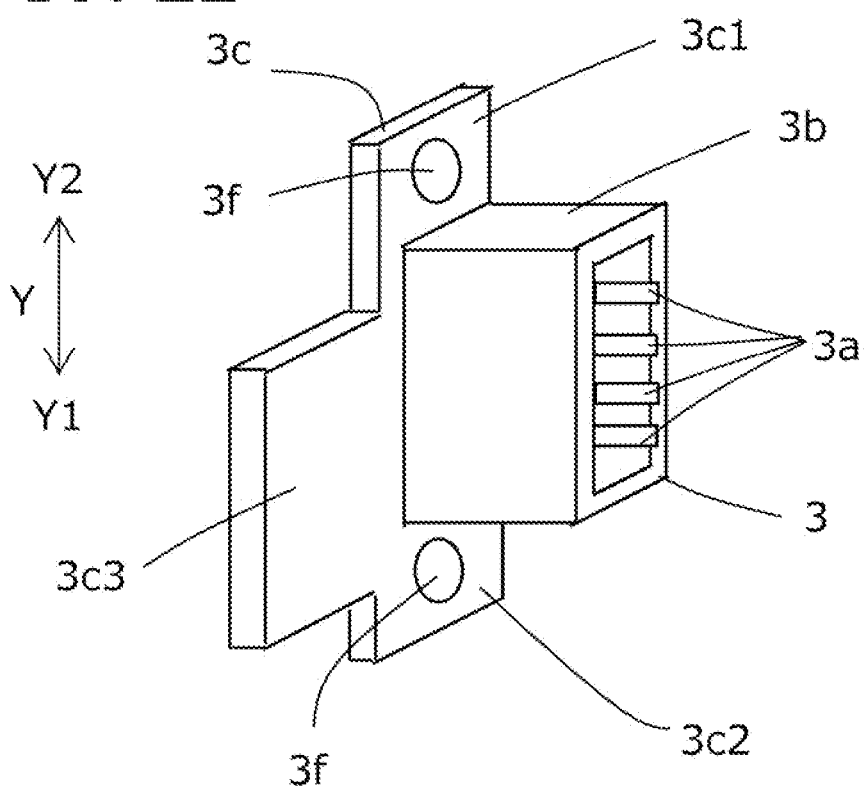

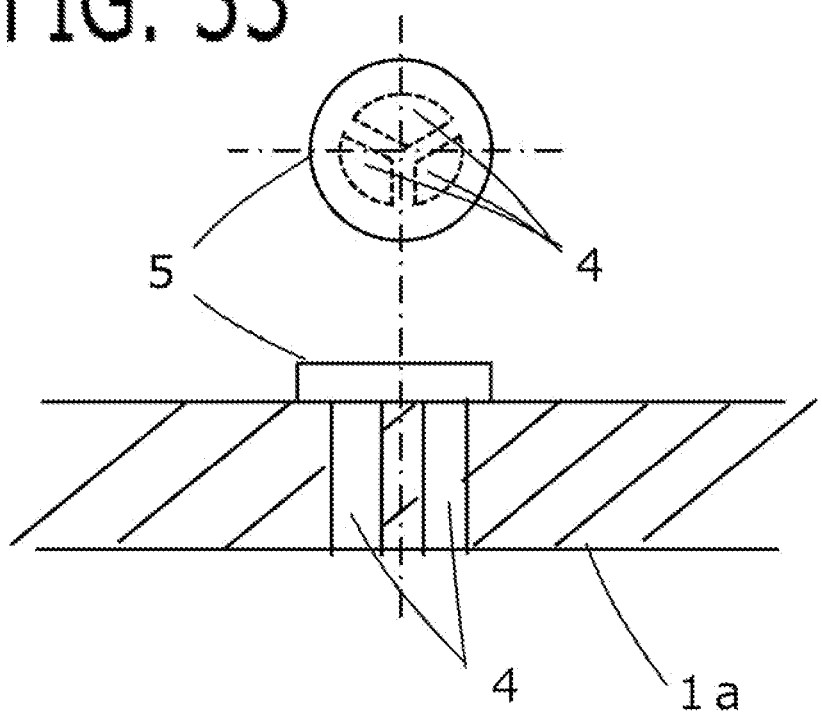
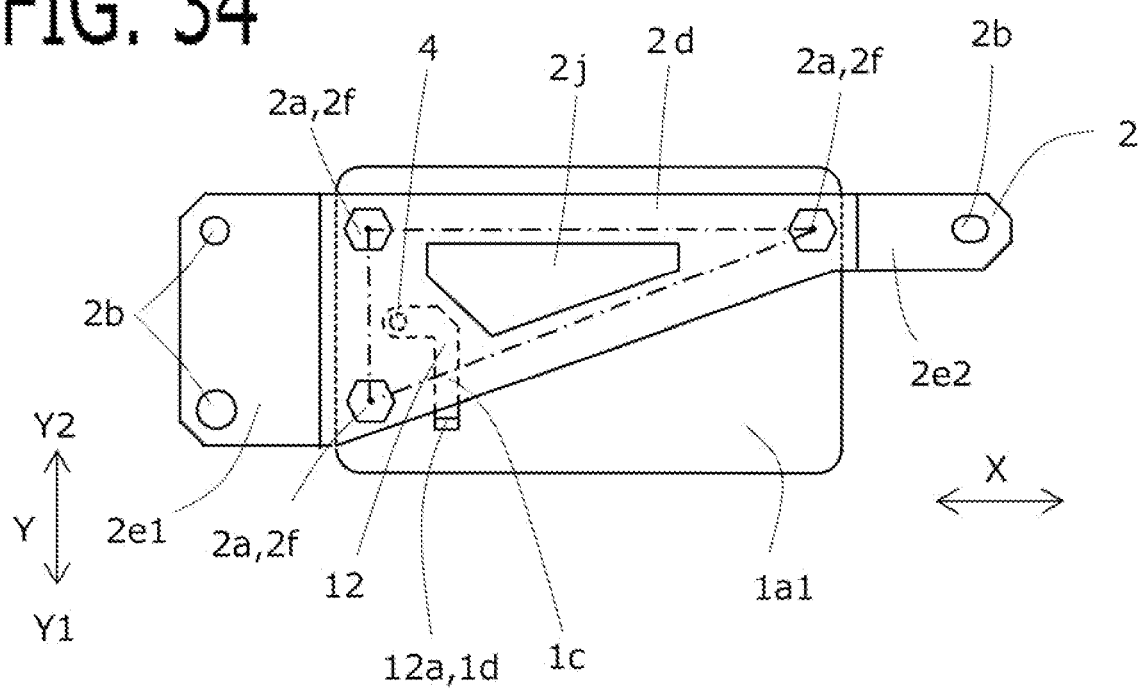

ELECTRONIC APPARATUS WITH A BRACKET AS A PROTECTIVE MEMBER

CROSS REFERENCE TO RELATED APPLICATIONS

This application is a National Stage of International Application No. PCT/JP2019/034695 filed Sep. 4, 2019.

TECHNICAL FIELD

The present disclosure relates to an electric apparatus.

BACKGROUND ART

In some cases, in an electric apparatus, in order to prevent deformation of a case and breakage of a seal due to the difference between an inner-case pressure and an outer-case pressure or to dispose an atmospheric pressure sensor in the case, the inner space of the case and outside are made to communicate with each other, so that a ventilation hole having an effect of making the inner-space pressure and the atmospheric pressure balance with each other is provided.

On the other hand, the ventilation hole can be a path for foreign materials to intrude into the inner space of the case. Accordingly, for example, as in the case of the technology disclosed in PLT 1, a dedicated lid member for covering the ventilation hole is provided.

CITATION LIST

Patent Literature

PLT 1: JP 2002-353675 A

SUMMARY OF INVENTION

Technical Problem

However, in the technology according to PLT 1, because it is required to provide a dedicated lid member for covering a ventilation hole and the like, the number of components increases and hence the production cost is raised.

Accordingly, there is desired an electric apparatus that can suppress the number of components from increasing and hence can suppress the production cost from rising, while providing a mechanism for covering the ventilation hole.

Solution to Problem

An electric apparatus according to the present disclosure including:
an electronic component;
a case that has an outer wall for containing the electronic component therein and is provided with a ventilation hole penetrating the outer wall;
a protective member for covering outside of the ventilation hole; and
one or both of a bracket for mounting the case to an external object and an external connector for electrically connecting the electronic component with outside,
wherein the protective member is a part of the bracket or a part of the external connector, and
wherein a communication path for making an outer opening portion of the ventilation hole communicate with outside is provided between the outer wall and the protective member.

Advantage of Invention

In an electric apparatus according to the present disclosure, a ventilation hole can be covered with a bracket or an external connector and hence the ventilation hole is protected from foreign materials such as water, dust, and flying matter. Moreover, because a communication path is provided, air can be circulated between the inside and the outside of a case through the ventilation hole and the communication path; thus, against a temperature change in the gas, caused by heat generation in an electronic component, the gaseous pressure in the case can appropriately be kept. Moreover, the bracket to be utilized for fixing the case to an external object or the external connector to be utilized for electrically connecting the electronic component with the outside can also be utilized for covering the outside of the ventilation hole and for providing the communication path. Accordingly, because no dedicated member for protecting the ventilation hole needs to be provided, the number of components can be suppressed from increasing and hence the production cost can be suppressed from rising.

BRIEF DESCRIPTION OF THE DRAWINGS

FIG. 3 is a cross-sectional view of each of the first and second examples of the electric apparatus according to Embodiment 1;

FIG. 4 is a plan view of the first example of the electric apparatus according to Embodiment 1, when viewed from the bottom wall side thereof;

FIG. 19 is a plan view of the electric apparatus according to Embodiment 3;

FIG. 20 is a perspective view of an electric apparatus according to Embodiment 4;

FIG. 21 is a cross-sectional view of the electric apparatus according to Embodiment 4;

FIG. 22 is a perspective view of an external connector according to Embodiment 4;

FIG. 33 is a partial plan view and a partial cross-sectional view of a ventilation hole according to another embodiment; and FIG. 34 is a plan view of an electric apparatus according to another embodiment.

DESCRIPTION OF EMBODIMENTS

1. Embodiment 1

Figure 1:
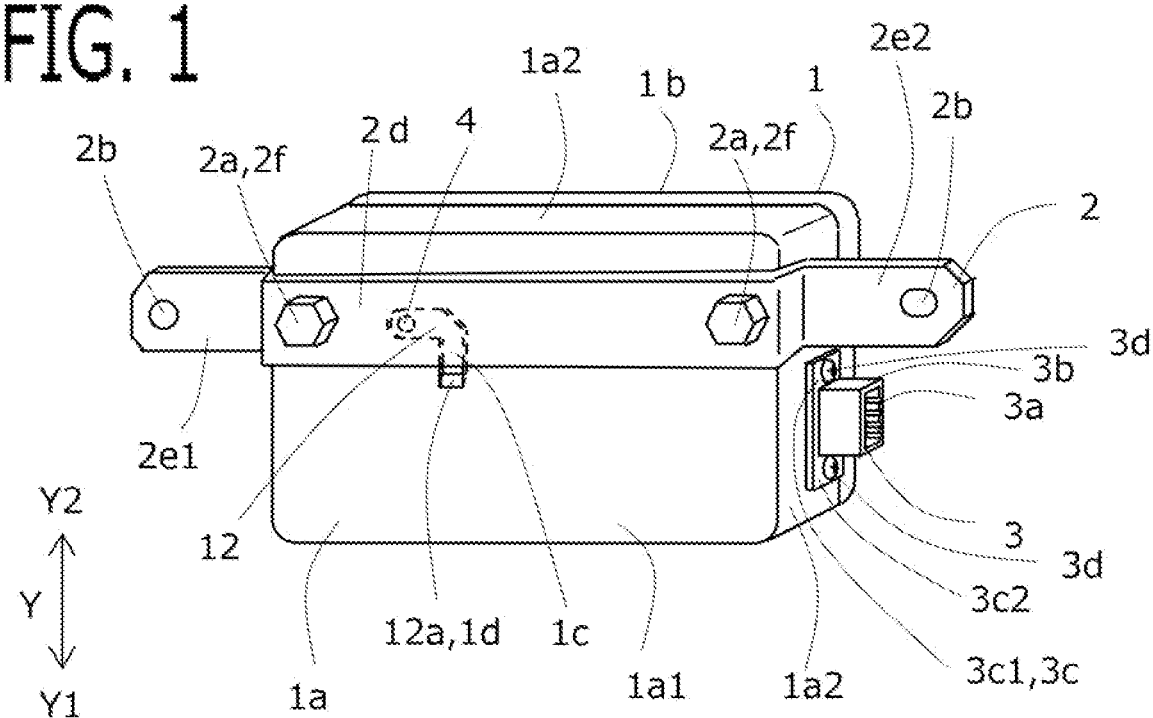
FIG. 1 is a perspective view of a first example of an electric apparatus according to Embodiment 1.
Figure 2:
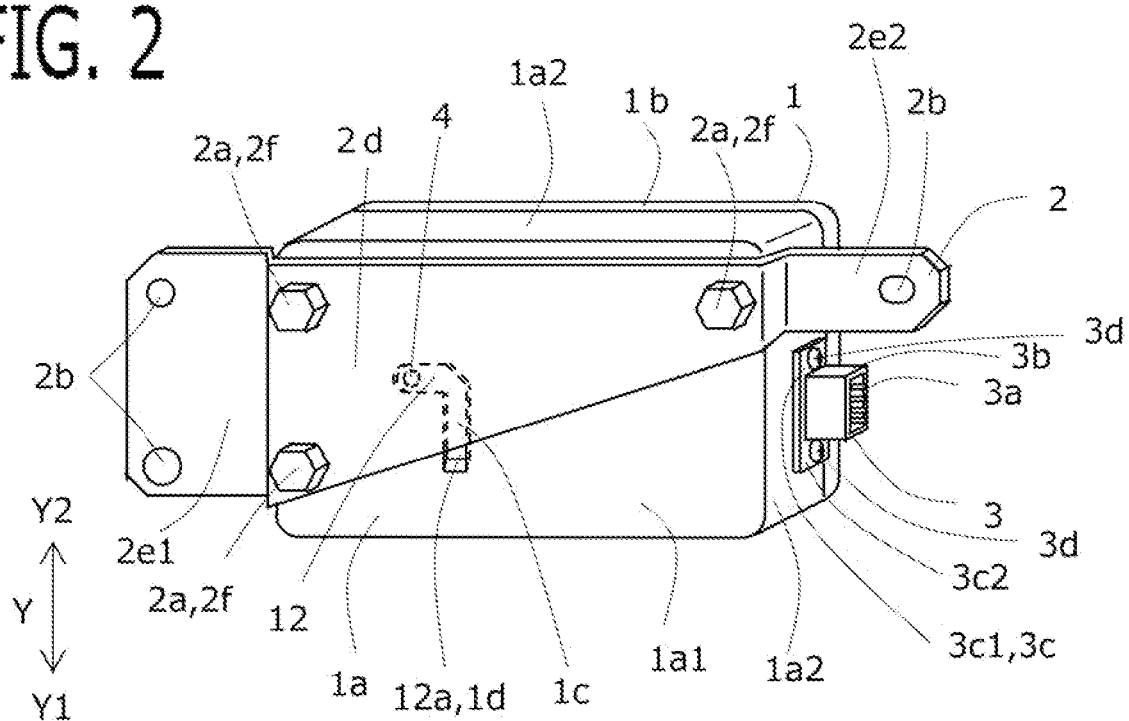
FIG. 2 is a perspective view of a second example of the electric apparatus according to Embodiment 1.
Figure 5:
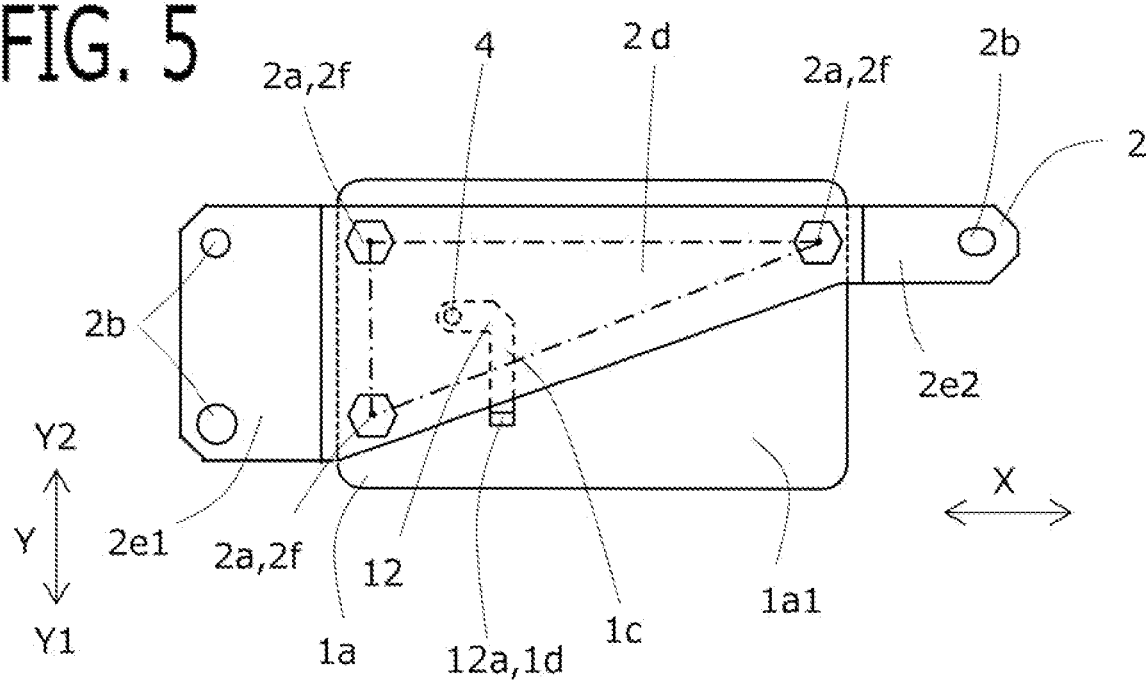
FIG. 5 is a plan view of the second example of the electric apparatus according to Embodiment 1, when viewed from the bottom wall side thereof.
Figure 6:
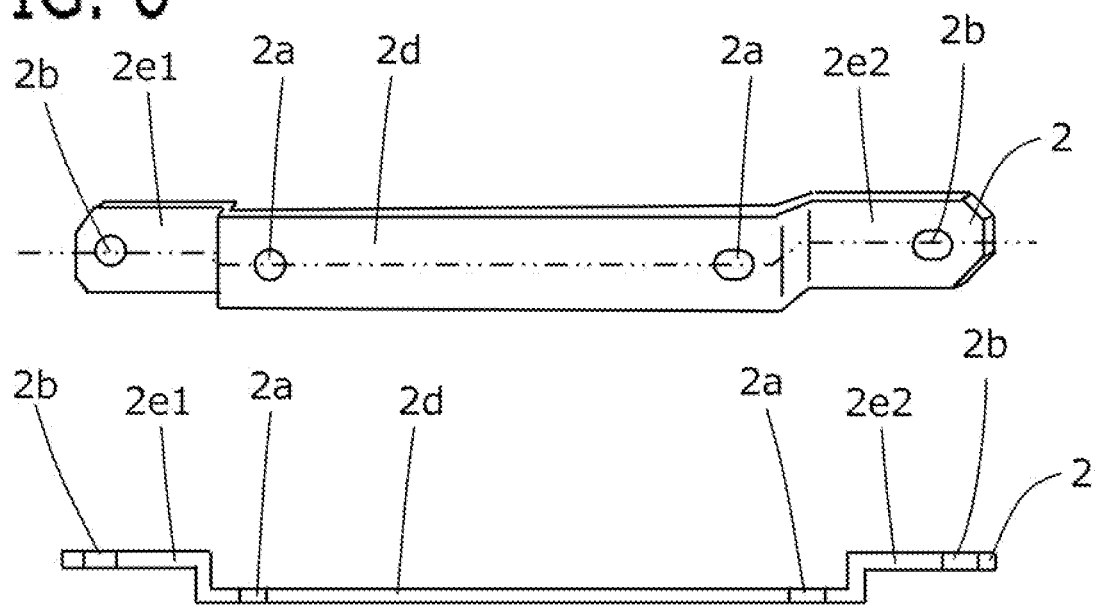
FIG. 6 is a set of a perspective view and a cross-sectional view of a bracket in the first example according to Embodiment 1.
Figure 7:
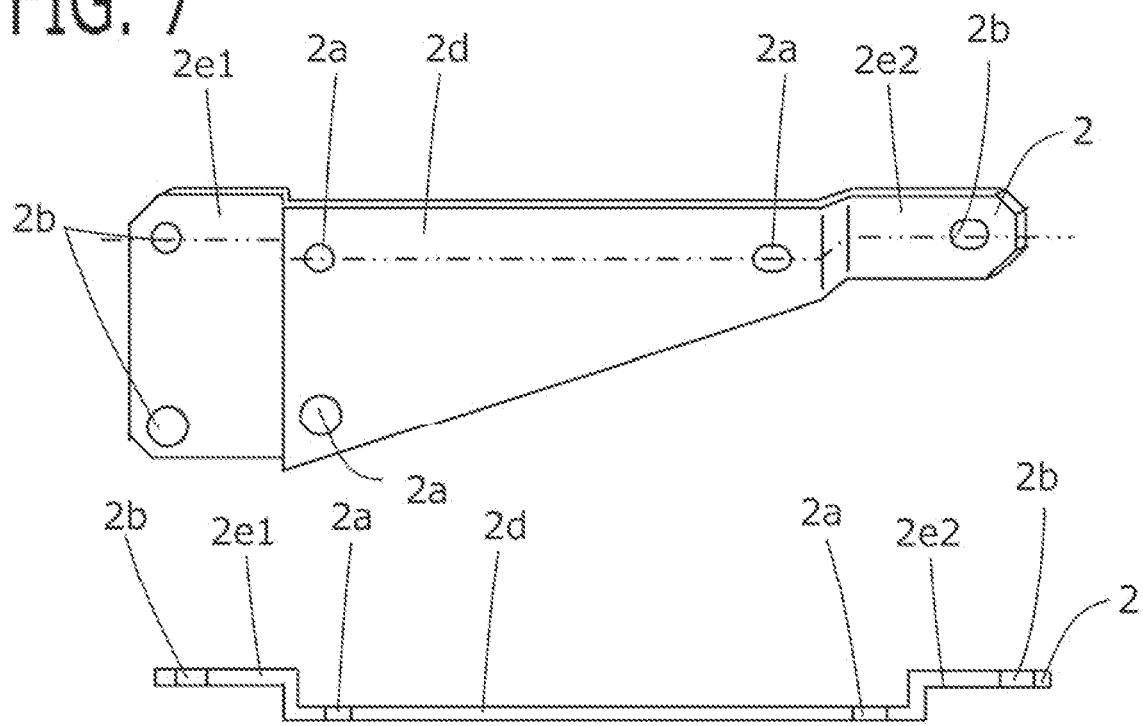
FIG. 7 is a set of a perspective view and a cross-sectional view of a bracket in the second example according to Embodiment 1.

An electric apparatus according to Embodiment 1 will be explained with reference to the drawings. In the present embodiment, two examples of the electric apparatus will be explained. FIG. 1 is a perspective view of a first example of the electric apparatus; FIG. 2 is a perspective view of a second example of the electric apparatus. FIG. 3 is a cross-sectional view of each of the first and second examples of the electric apparatus. FIG. 4 is a plan view of the first example of the electric apparatus, when it is viewed from a bottom wall 1a1 side thereof; FIG. 5 is a plan view of the second example of the electric apparatus, when it is viewed from a bottom wall 1a1 side thereof. FIG. 6 is a set of a perspective view of a bracket 2 in the first example of the electric apparatus and a cross-sectional view thereof taken along the double-dot chain line in the perspective view. FIG. 7 is a set of a perspective view of a bracket 2 in the second example of the electric apparatus and a cross-sectional view thereof taken along the double-dot chain line in the perspective view.

In each of the drawings, there are illustrated the lower side Y1 and the upper side Y2 in the vertical direction at a time when the electric apparatus is mounted in an external object by means of a bracket 2.

The electric apparatus has electronic components 11, a case 1, a bracket 2, an external connector 3, and the like. For example, the electric apparatus is a vehicle radar such as a millimeter wave radar or a laser radar to be mounted in a vehicle. The electric apparatus is mounted in a vehicle as an external object. For example, the electric apparatus is disposed in the hood or the like of a vehicle. Accordingly, the electric apparatus is under an environment where it is liable to be exposed to water, dust, and flying matter. In particular, during a travel under rainy weather, washing of a vehicle, or the like, there is probability that water powerfully splashes on the electric apparatus from all directions. Moreover, the electric apparatus is under an environment where it is liable to vibrate due to vibration of a vehicle.

The two or more electronic components 11 are provided and are mounted on a circuit board 11a. The case 1 has an outer wall for containing the electronic components 11 therein and a ventilation hole 4 penetrating the outer wall. In the present embodiment, the outer wall of the case 1 includes a first case 1a having the shape of a bottomed tube and a second case 1b for covering the opening portion of the first case 1a. The bonding portion between the first case 1a and the second case 1b has a fitting structure and is airtightly sealed by a sealing member. The first case 1a is formed in the shape of a rectangular bottomed tube and has a rectangular-plate-shaped bottom wall 1a1 and four rectangular-plate-shaped circumferential walls 1a2. The ventilation hole 4 is provided in the bottom wall 1a1 and penetrates the bottom wall 1a1.

When the electric apparatus is mounted in an external object, the bottom wall 1a1 and the respective sides of the circumferential walls lag become parallel to the vertical direction Y or the horizontal direction X. The outer side surface of the bottom wall 1a1 is parallel to the vertical direction Y. In addition, it may be allowed that the bottom wall 1a1 and the respective sides of the circumferential walls lag are inclined from the vertical direction Y or the horizontal direction X (for example, within ±20° from the vertical direction Y or the horizontal direction X).

The external connector 3 electrically connects the electronic components 11 with the outside. The external connector 3 has connection terminals 3a, a housing portion 3b surrounding the periphery of the connection terminals 3a, and a flange portion 3c protruding toward the outer circumferential side of the housing portion 3b. The flange portion 3c is disposed at the outside of the outer wall (circumferential wall lag) of the case 1 so as to be attached to the outer wall.

The connection terminals 3a are electric conductors such as copper; four pieces of the connection terminals 3a are arranged in parallel with one another. Each of the connection terminals 3a penetrates the outer wall (circumferential wall lag) of the case 1; one end of the connection terminal 3a is connected with the electronic component 11 and the other end thereof is exposed to the outside of the case 1. The housing portion 3b is formed in the shape of a tube (rectangular tubular, in this example) and surrounds the periphery of the connection terminal 3a that is exposed to the outside of the case 1. The flange portion 3c has a rectangular-plate-shaped first flange portion 3c1 protruding from the housing portion 3b toward a first side (the upper side Y2, in this example) and a rectangular-plate-shaped second flange portion 3c2 protruding from the housing portion 3b toward a second side (the lower side Y1, in this example) opposite to the first side. A through-hole to be penetrated by a screw $3d$ is formed in each of the first flange portion $3c1$ and the second flange portion $3c2$. The screw $3d$ is inserted into the through-hole in each of the first flange portion $3c1$ and the second flange portion $3c2$ so as to be screwed to a screw hole provided in the outer wall (the circumferential wall lag) of the case 1. As a result, the external connector 3 is fixed to the case 1.

The bracket 2 is a mounting member for mounting the case 1 to an external object. The bracket 2 is mounted in such a way as to cover the outside of the ventilation hole 4. The bracket 2 has case-fixing portions $2a$ to be mounted to the case 1 and mounting-point fixing portions $2b$ to be mounted to an external object.

In the present embodiment, the bracket 2 has a case-side plate-shaped portion $2d$ having the shape of a plate and extending along the outer wall of the case 1 and arm portions $2e1$ and $2e2$ that each extend from the case-side plate-shaped portion $2d$ in respective directions departing from the case 1. The case-fixing portion $2a$ is provided in the case-side plate-shaped portion $2d$; the mounting-point fixing portion $2b$ is provided in each of the arm portions $2e1$ and $2e2$.

Along the outer side surface of the bottom wall $1a1$, the case-side plate-shaped portion $2d$ extends from one end to the other end of the bottom wall $1a1$. In the present embodiment, along the outer side surface of the bottom wall $1a1$, the case-side plate-shaped portion $2d$ extends from one end (the left side in the drawing) to the other end (the right side in the drawing) of the bottom wall $1a1$ in the horizontal direction X. In the first example, the case-side plate-shaped portion $2d$ is formed in the shape of an elongated rectangular plate extending in the horizontal direction X; in the second example, the case-side plate-shaped portion $2d$ is formed in the shape of a trapezoidal plate whose upper end extends in the horizontal direction X and whose lower end extends in an inclined direction that is inclined from the horizontal direction X.

The facing side of the case-side plate-shaped portion $2d$, which faces the bottom wall $1a1$ abuts on the outer side surface of the bottom wall $1a1$. In the first example, the case-fixing portion $2a$ is provided at the periphery of each of the one end and the other end of the case-side plate-shaped portion $2d$. In the present embodiment, as illustrated in FIG. 6, the case-fixing portion $2a$ is a through-hole to be penetrated by a bolt $2f$; the bolt $2f$ is inserted into the through-hole of the case-fixing portion $2a$ and is screwed to a bolt hole provided in the case 1 (the bottom wall $1a1$ and the circumferential wall $1a2$, in this example). As described above, in the first example, the bracket 2 is fixed to the case 1 at the two fixing positions.

In the second example, two pieces of the case-fixing portions $2a$ are provided at the periphery of one end (the left side in the drawing) of the case-side plate-shaped portion $2d$, and one piece of the case-fixing portion $2a$ is provided at the periphery of the other end (the right side in the drawing) of the case-side plate-shaped portion $2d$. In the present embodiment, as illustrated in FIG. 7, the case-fixing portion $2a$ is a through-hole to be penetrated by a bolt $2f$; the bolt $2f$ is inserted into the through-hole of the case-fixing portion $2a$ and is screwed to a bolt hole provided in the case 1 (the bottom wall $1a1$ and the circumferential wall $1a2$, in this example). As described above, in the second example, the bracket 2 is fixed to the case 1 at the three fixing positions.

In each of the first and second examples, there are provided the first arm portion $2e1$ that is bent twice from the one end (the left side in the drawing) of the case-side plate-shaped portion $2d$ and then extends in a direction departing from the case 1 (to the left side in the drawing) and the second arm portion $2e2$ that is bent twice from the other end (the right side in the drawing) of the case-side plate-shaped portion $2d$ and then extends in a direction departing from the case 1 (to the right side in the drawing). Each of the first arm portion $2e1$ and the second arm portion $2e2$ is a plate-shaped member.

In the first example, one piece of the mounting-point fixing portion $2b$ is provided in each of the first arm portion $2e1$ and the second arm portion $2e2$. In the second example, two pieces of the mounting-point fixing portions $2b$ are provided in the first arm portion $2e1$, and one piece of the mounting-point fixing portion $2b$ is provided in the second arm portion $2e2$. Each of the mounting-point fixing portions $2b$ is a through-hole to be penetrated by a bolt or the like. When the electric apparatus is mounted to an external object, a bolt or the like is inserted into the through-hole and is screwed to a bolt hole formed in the external object such as a vehicle body.

As described above, a part of the bracket 2 (the case-side plate-shaped portion $2d$, in this example) covers the outside of the ventilation hole 4. In addition, a communication path 12 for making the outer opening portion of the ventilation hole 4 communicate with the outside is provided between the outer wall (the bottom wall $1a1$) of the case 1 and part (case-side plate-shaped portion $2d$) of the bracket 2. In the present embodiment, the outer opening portion of the ventilation hole 4 is an opening portion of the ventilation hole 4, which opens to the outside of the case 1; the inner opening portion of the ventilation hole 4 is an opening portion of the ventilation hole 4, which opens to the inside of the case 1.

This configuration makes it possible that the bracket 2 covers the ventilation hole 4 and hence the ventilation hole 4 is protected from foreign materials such as water, dust, and flying matter; thus, for example, the ventilation hole 4 can be suppressed from being clogged or foreign materials can be suppressed from intruding into the case 1 through the ventilation hole 4. Moreover, because the communication path 12 is provided, air can be circulated between the inside and the outside of the case 1 through the ventilation hole 4 and the communication path 12; thus, against a temperature change in the gas, caused by heat generation in the electronic component 11, the gaseous pressure in the case 1 can appropriately be kept. Because the bracket 2 strong enough to be able to fix the electric apparatus to an external object is utilized, the protective strength for the ventilation hole 4 and the strength of the ventilation hole 4 can be raised.

Moreover, the bracket 2 to be utilized for fixing the case 1 to an external object can also be utilized for covering the outside of the ventilation hole 4 and for providing the communication path 12. Accordingly, because no dedicated member for protecting the ventilation hole 4 needs to be provided, the number of components can be suppressed from increasing and hence the production cost can be suppressed from rising.

In the present embodiment, a groove $1c$ extending from the outer opening portion of the ventilation hole 4 is formed in the outer side surface of the outer wall (the bottom wall $1a1$) of the case 1. In addition, the communication path 12 is formed in such a way that a part of the groove other than an end portion $1d$ (hereinafter, referred to as an opening-side end portion $1d$) opposite to the outer opening portion of the ventilation hole 4 is covered with the case-side plate-shaped portion $2d$ of the bracket 2. Accordingly, the opening-side end portion 1*d*, of the groove 1*c*, that is not covered with the bracket 2 is an opening portion 12*a* to the outside of the communication path 12.

This configuration makes it possible to provide the communication path 12 by use of a simple structure in which the groove 1*c* is formed in the outer side surface of the outer wall of the case 1 and in which a part of the groove 1*c* other than the opening-side end portion 1*d* thereof is covered with the bracket 2. That is to say, because it is only necessary to form a groove in the outer wall of the case 1, the production cost can be suppressed from increasing.

Figure 8:
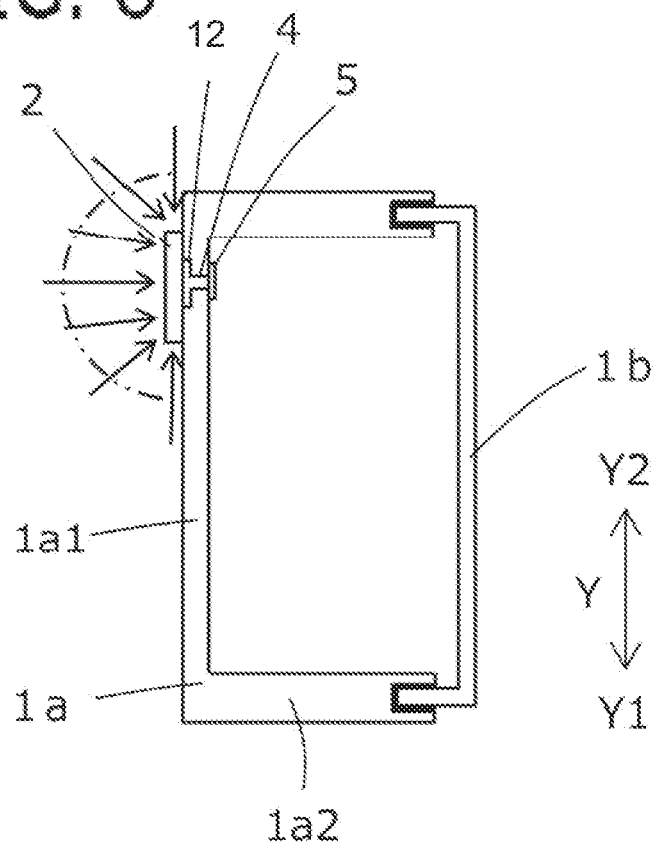
FIG. 8 is a schematic view for explaining water splashing according to Embodiment 1.

A part of the outer side surface, of the outer wall (the bottom wall 1*a*1) of the case 1, that is around the groove 1*c* (except the opening-side end portion 1*d*) abuts on the facing side of the case-side plate-shaped portion 2*d* of the bracket 2. Therefore, the bracket 2 covers the groove 1*c* except the opening-side end portion 1*d*. As a result, even when as illustrated by two or more arrows in FIG. 8, water splashes on the communication path 12 from two or more directions, the water can be suppressed from intruding thereinto.

When the electric apparatus is mounted to an external object, the communication path 12 (the groove 1*c* included in the communication path 12) extends from the opening portion 12*a* to the outside thereof in a direction (the direction parallel to the upper side Y2, in this example) including the component of the upper side Y2. This configuration makes it possible that foreign material such as water does not easily intrude into the communication path 12 and that even when foreign material such as water intrudes into the communication path 12, gravity discharges the foreign material from the communication path 12.

In addition, it is only necessary that the communication path 12 extends from the opening portion 12*a* thereof in a direction including the component of the upper side Y2; the communication path 12 may extend in a direction inclined from the upper side Y2 (e.g., the direction inclined as large as ±45° from the upper side Y2) within an area including the component at the upper side Y2).

In the present embodiment, when the electric apparatus is mounted to an external object, the communication path 12 (the groove 1*c* included in the communication path 12) extends from the opening portion 12*a* to the outside thereof in a direction (the direction parallel to the upper side Y2, in this example) including the component of the upper side Y2; after that, the communication path 12 is bent and then extends in the horizontal direction X or in a direction including the component of the upper side Y2 (in the horizontal direction X, in this example) up to the outer opening portion of the ventilation hole 4.

This configuration makes it possible that even when water intrudes through the opening portion 12*a* of the communication path 12, the bending portion abates the water intrusion; thus, the water can be suppressed from reaching the outer opening portion of the ventilation hole 4. That is to say, bending the communication path 12 makes it possible to raise the effect of suppressing foreign material from intruding into the ventilation hole 4. Because the communication path 12 at the inner side extends in the horizontal direction X or in a direction including the component of the upper side Y2, it is made possible that even when water intrudes to a place more inside than the bending portion, the water is suppressed from being accumulated in the inner communication path 12.

In addition, it is only necessary that the extending angle of the communication path 12 at the place more close to the opening portion 12*a* than the bending portion is different from the extending angle of the communication path 12 at the place more inside than the bending portion so that the communication path 12 is bent.

Figure 9:
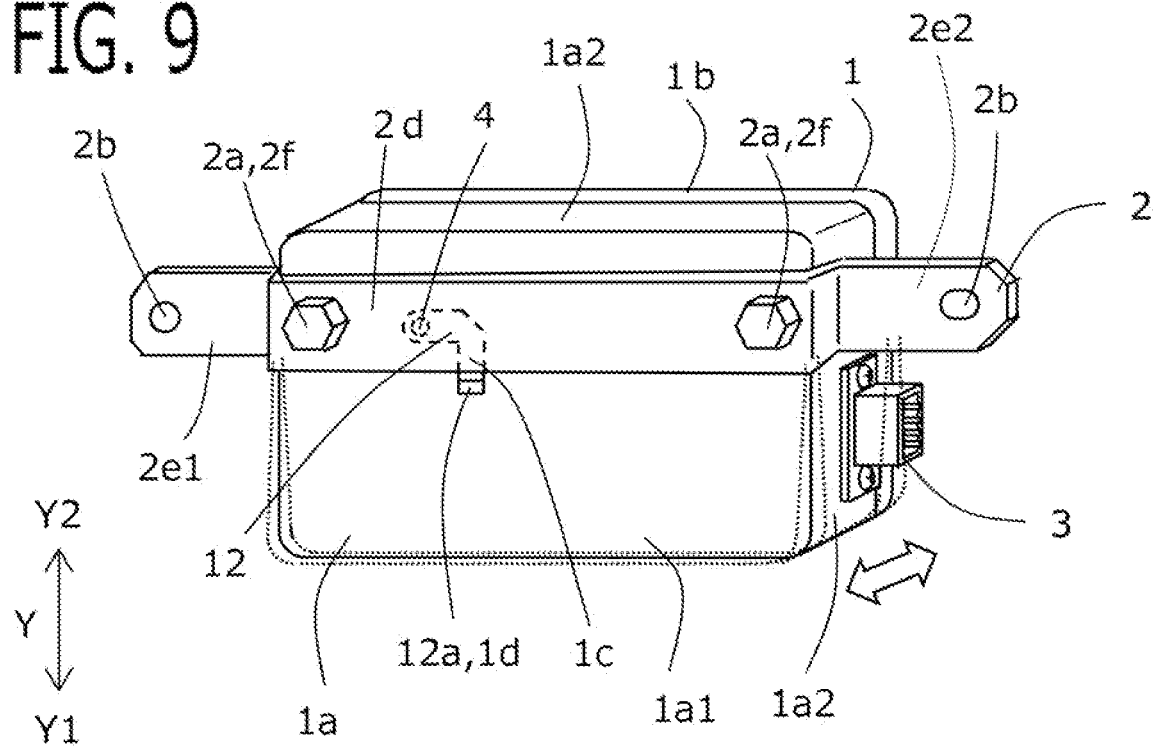
FIG. 9 is a perspective view for explaining behavior of the first example according to Embodiment 1, when it vibrates.
Figure 10:
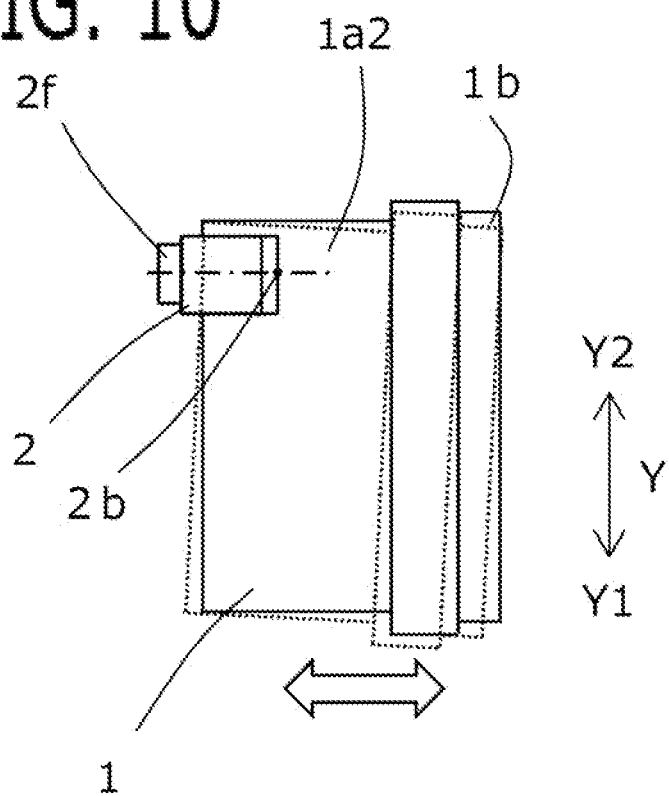
FIG. 10 is a side view for explaining behavior of the first example according to Embodiment 1, when it vibrates.

As described above, in the first example, the case-side plate-shaped portion 2*d* of the bracket 2 is fixed to the case 1 at the two fixing positions (case-fixing portions 2*a*). The ventilation hole 4 and the communication path 12 are arranged in an area that connects the two fixing positions. This configuration makes it possible that in the area that connects the two fixing positions, the adhesion strength between the facing side of the case-side plate-shaped portion 2*d* of the bracket 2 and the outer side surface of the outer wall (the bottom wall 1*a*1) of the case 1 is raised. Moreover, even in the case where as the present embodiment, the electric apparatus is mounted to a vehicle and hence is liable to be vibrated, the case 1 and the bracket 2 vibrate in synchronization with each other on the axis that connects the two fixing positions, as the shakes at a time of vibration illustrated in FIGS. 9 and 10. Therefore, the adhesion strength can be suppressed from being deteriorated due to the vibration.

Figure 11:
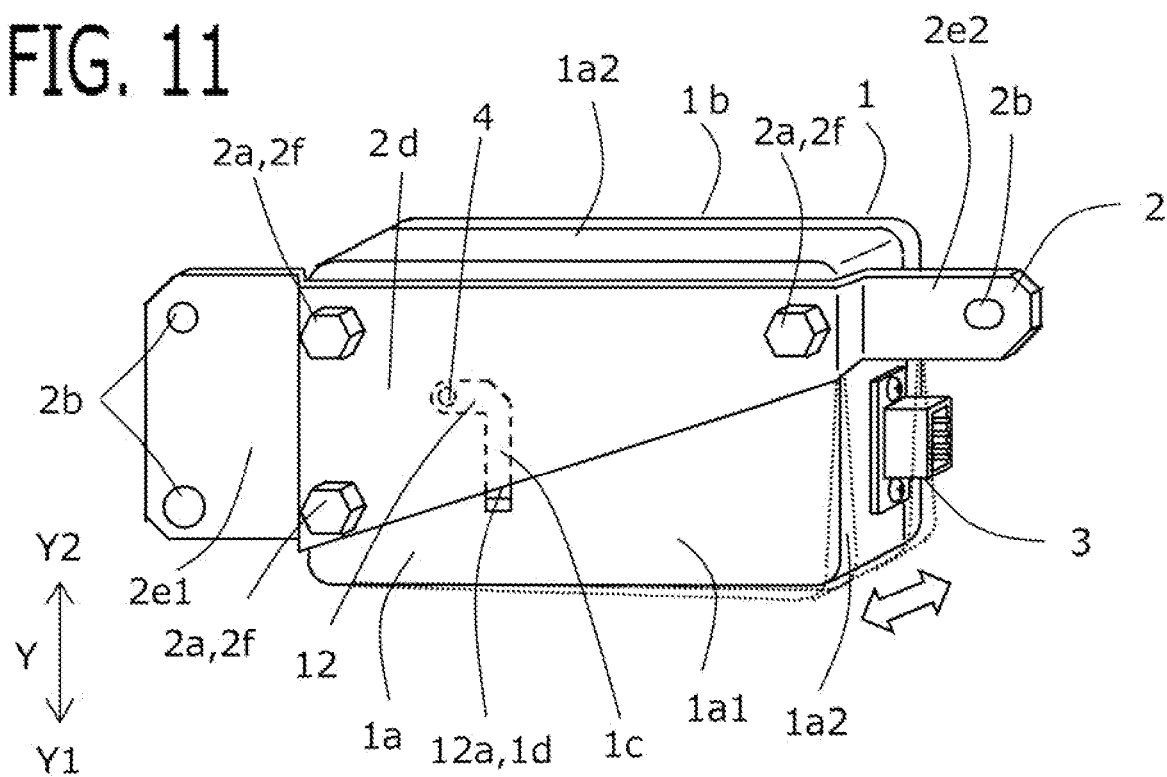
FIG. 11 is a perspective view for explaining behavior of the second example according to Embodiment 1, when it vibrates.

As described above, in the second example, the case-side plate-shaped portion 2*d* of the bracket 2 is fixed to the case 1 at the three fixing positions (case-fixing portions 2*a*). The ventilation hole 4 is disposed in an area inside the three fixing positions (case-fixing portions 2*a*). In FIG. 5, the three fixing positions (case-fixing portions 2*a*) are connected with one another by a one-dot chain line; the area inside the one-dot chain line is the area inside the three fixing positions. This configuration makes it possible that in the area inside the three fixing positions, the adhesion strength between the facing side of the case-side plate-shaped portion 2*d* of the bracket 2 and the outer side surface of the outer wall (the bottom wall 1*a*1) of the case 1 is raised. Moreover, even in the case where as the present embodiment, the electric apparatus is mounted to a vehicle and hence is liable to be vibrated, the case 1 and the bracket 2 vibrate in synchronization with each other in the area inside the three fixing positions, as the shakes at a time of vibration illustrated in FIG. 11. Therefore, the adhesion strength can be suppressed from being deteriorated due to the vibration.

Figure 12:
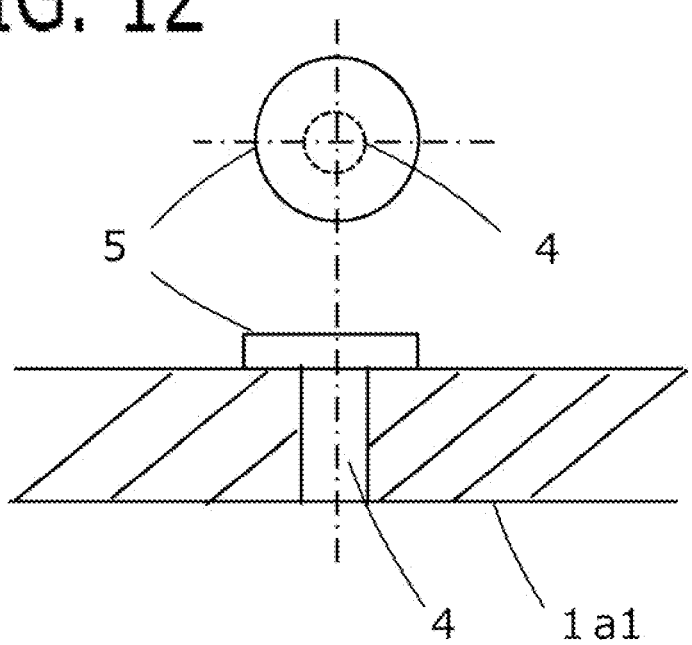
FIG. 12 is a set of partial plan view and a partial cross-sectional view of a ventilation hole according to Embodiment 1.

As the partial plan view and the partial cross-sectional view of the ventilation hole 4 illustrated in FIG. 12, a waterproof ventilation filter 5 for covering the inner opening portion of the ventilation hole 4 is provided. The waterproof ventilation filter 5 is a filter having a function of allowing air to pass but suppressing water from passing. For example, the diameter of a microscopic hole in the filter is adjusted, so that the filter has both the air permeability and the waterproof property.

2. Embodiment 2

Next, an electric apparatus according to Embodiment 2 will be explained. The explanation for constituent parts the same as those in Embodiment 1 will be omitted. The basic configuration of the electric apparatus according to the present embodiment is the same as that according to Embodiment 1. The present embodiment is different from Embodiment 1 in that a groove included in the communication path 12 is formed not in the case 1 but in the bracket 2.

Figure 13:
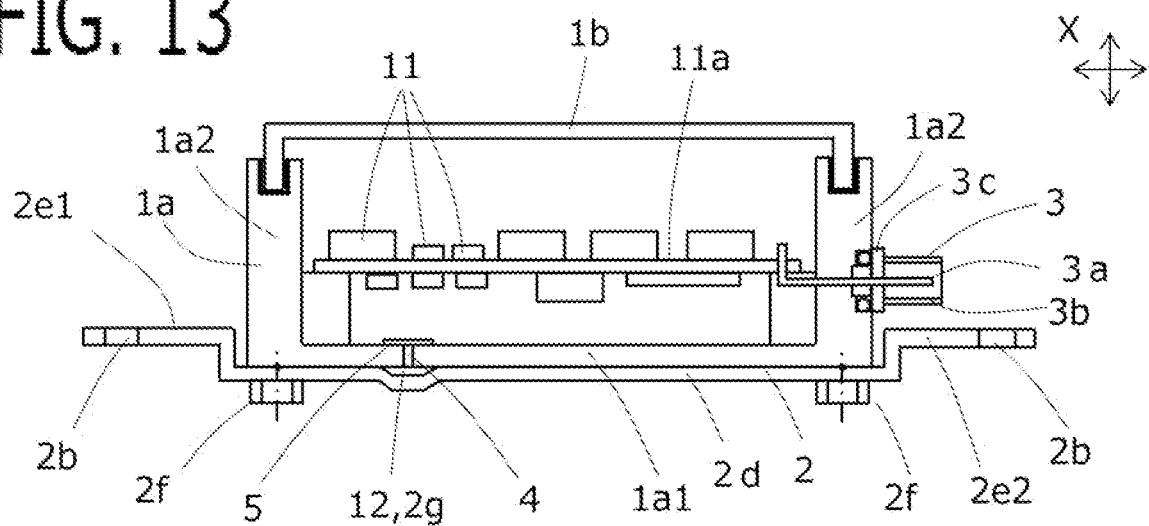
FIG. 13 is a cross-sectional view of each of first and second examples of an electric apparatus according to Embodiment 2.
Figure 14:
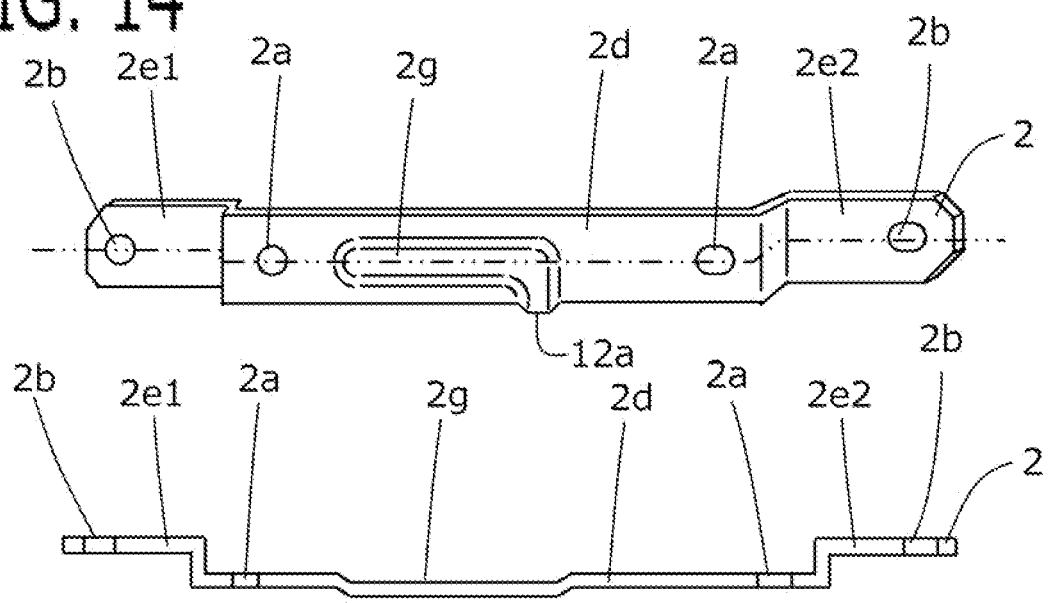
FIG. 14 is a set of a perspective view and a cross-sectional view of a bracket in the first example of the electric apparatus according to Embodiment 2.
Figure 15:
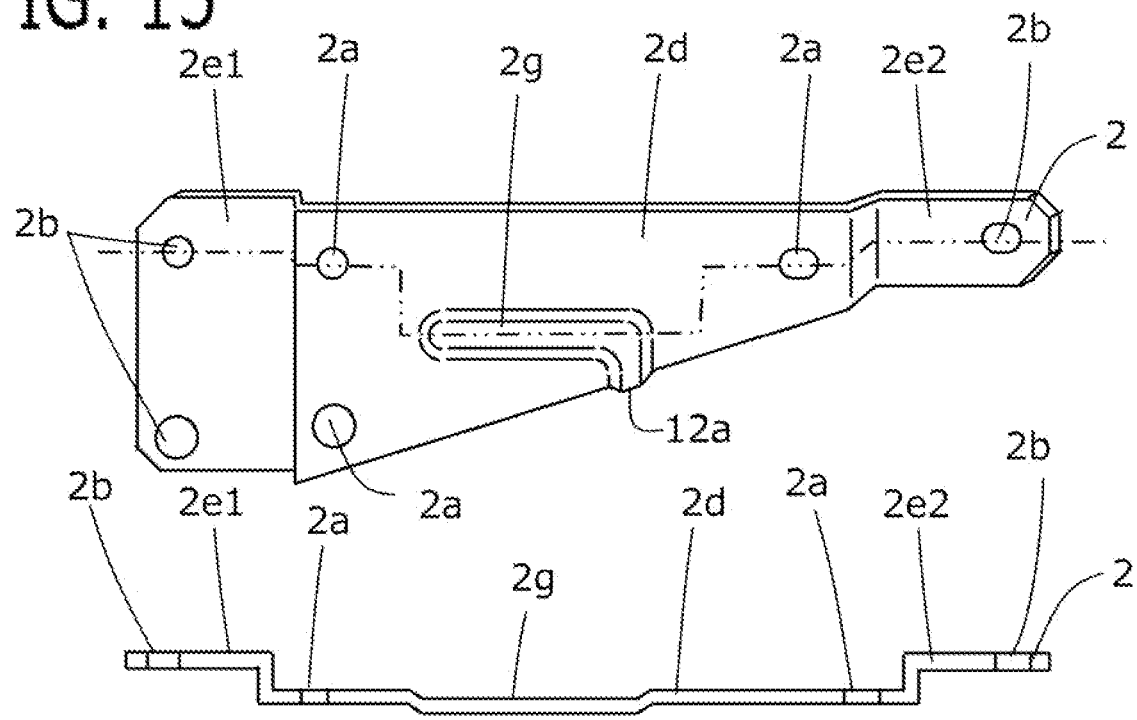
FIG. 15 is a set of a perspective view and a cross-sectional view of a bracket in the second example of the electric apparatus according to Embodiment 2.

As is the case with Embodiment 1, two examples of the electric apparatus will be explained also in the present embodiment. FIG. 13 is a cross-sectional view of each of the first and second examples of the electric apparatus. FIG. 14 is a set of a perspective view of a bracket 2 in the first example of the electric apparatus and a cross-sectional view thereof taken along the double-dot chain line in the perspective view. FIG. 15 is a set of a perspective view of a bracket 2 in the second example of the electric apparatus and a cross-sectional view thereof taken along the double-dot chain line in the perspective view.

In the present embodiment, in the facing side, of the case-side plate-shaped portion 2d of the bracket 2, that faces the ventilation hole 4, there is formed a groove 2g that extends from the portion facing the ventilation hole 4 to the end portion of the facing side of the case-side plate-shaped portion 2d. The communication path 12 is formed in such a way that the portion of the groove 2g in the case-side plate-shaped portion 2d of the bracket 2 is covered with the outer wall (the bottom wall 1a1) of the case 1. The groove 2g opens toward the extending direction thereof at the end portion of the facing side of the case-side plate-shaped portion 2d; this opening portion, which is not covered with the outer wall (the bottom wall 1a1) of the case 1, is the opening portion 12a to the outside of the communication path 12.

This configuration makes it possible to provide the communication path 12 by use of a simple structure in which the groove 2g is formed in the facing side of the case-side plate-shaped portion 2d of the bracket 2 and in which the outer wall (the bottom wall 1a1) of the case 1 is covered with the bracket 2. That is to say, because it is only necessary to form the groove 2g in the bracket 2, the production cost can be suppressed from increasing.

In the present embodiment, the groove 2g is formed by applying press working to the bracket 2 having the shape of a flat plate so as to bend the flat plate; thus, the production cost can be suppressed from increasing.

Also in the present embodiment, as illustrated in FIGS. 14 and 15, in the first and second examples, when the electric apparatus is mounted to an external object, the communication path 12 (in this example, the groove 2g included in the communication path 12) extends from the opening portion 12a to the outside thereof in a direction (the direction parallel to the upper side Y2, in this example) including the component of the upper side Y2.

In addition, when the electric apparatus is mounted to an external object, the communication path 12 (the groove 2g included in the communication path 12) extends from the opening portion 12a to the outside thereof in a direction (the direction parallel to the upper side Y2, in this example) including the component of the upper side Y2; after that, the communication path 12 is bent and then extends in the horizontal direction X or in a direction including the component of the upper side Y2 (in the horizontal direction X, in this example) up to the outer opening portion of the ventilation hole 4.

3. Embodiment 3

Next, an electric apparatus according to Embodiment 3 will be explained. The explanation for constituent parts the same as those in Embodiment 1 will be omitted. The basic configuration of the electric apparatus according to the present embodiment is the same as that according to Embodiment 1. The present embodiment is different from Embodiment 1 in that the communication path 12 is formed in the gap between the outer wall (the bottom wall 1a1) of the case 1 and the case-side plate-shaped portion 2d of the bracket 2.

Figure 16:
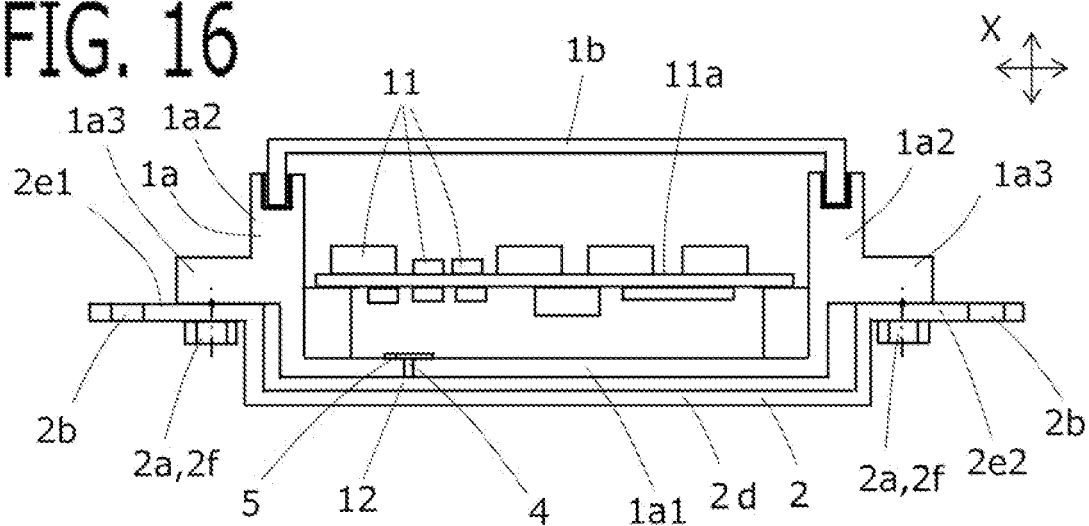
FIG. 16 is a cross-sectional view of an electric apparatus according to Embodiment 3.

FIG. 16 is a cross-sectional view of the electric apparatus according to the present embodiment. As illustrated in this drawing, the respective case-fixing portions 2a for mounting the bracket 2 to the case 1 are provided in the first arm portion 2e1 and the second arm portion 2e2 that each extend from the case-side plate-shaped portion 2d and then are bent twice. The bolt 2f is inserted into a through-hole in the case-fixing portion 2a so as to be screwed to a bolt hole provided in the case 1 (in this example, a boss portion 1a3 protruding from the circumferential wall 1ag to the outside).

The lengths of the respective bending portions of the first arm portion 2e1 and the second arm portion 2e2 are adjusted so that a gap occurs between the bottom wall 1a1 of the case 1 where the ventilation hole 4 is provided and the case-side plate-shaped portion 2d of the bracket 2. In the present embodiment, the gap length is constant. Then, the communication path 12 is formed in the gap between the bottom wall 1a1 of the case 1 and the case-side plate-shaped portion 2d of the bracket 2.

The gap between the bottom wall 1a1 of the case 1 and the case-side plate-shaped portion 2d of the bracket 2 opens toward the lower side Y1, the upper side Y2, and the like; these openings are the opening portions 12a of the communication path 12.

Figure 17:
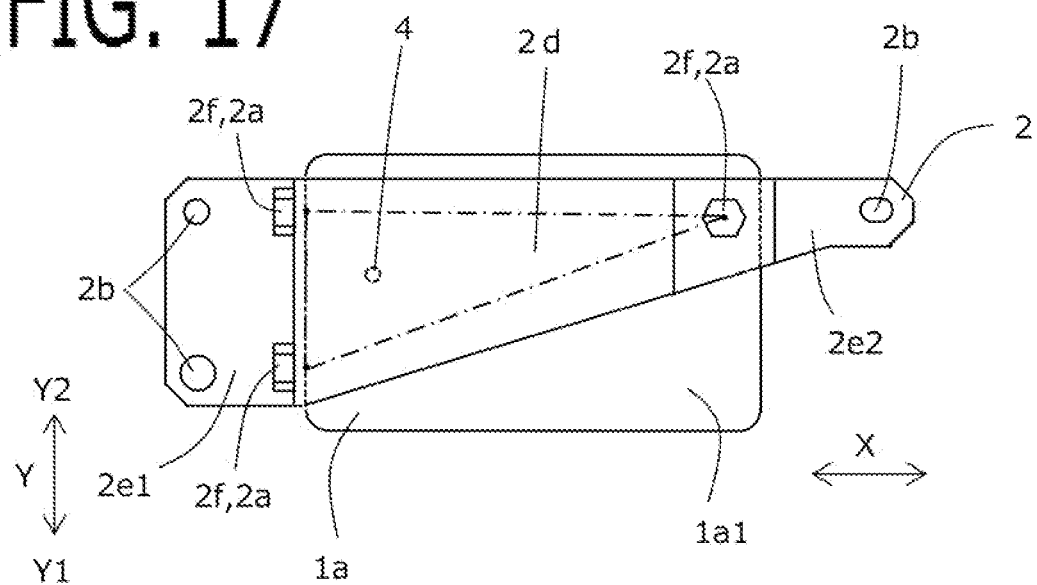
FIG. 17 is a plan view of the electric apparatus according to Embodiment 3.

Next, a first alternative example of the present embodiment will be explained. FIG. 17 is a plan view of an electric apparatus according to the first alternative example of the present embodiment, when it is viewed from a bottom wall 1a1 side thereof. As illustrated in this drawing, the respective case-fixing portions 2a for mounting the bracket 2 to the case 1 are provided in the first arm portion 2e1 (at the left side in the drawing) that extends from the case-side plate-shaped portion 2d and then are bent twice and at the other end (the right side in the drawing) of the case-side plate-shaped portion 2d. The bolt 2f is inserted into a through-hole in the case-fixing portion 2a so as to be screwed to a bolt hole provided in the case 1. A level-difference portion protruding toward the case 1 is provided at the other end (the right side in the drawing) of the case-side plate-shaped portion 2d, in which the case-fixing portion 2a is provided. The protruding height of this level-difference portion makes a gap between the bottom wall 1a1 of the case 1 and the case-side plate-shaped portion 2d of the bracket 2 and adjusts the width of the gap. In the present embodiment, press working is applied to a flat-plate-shaped member so as to bend the plate, so that the level-difference portion is formed.

Figure 18:
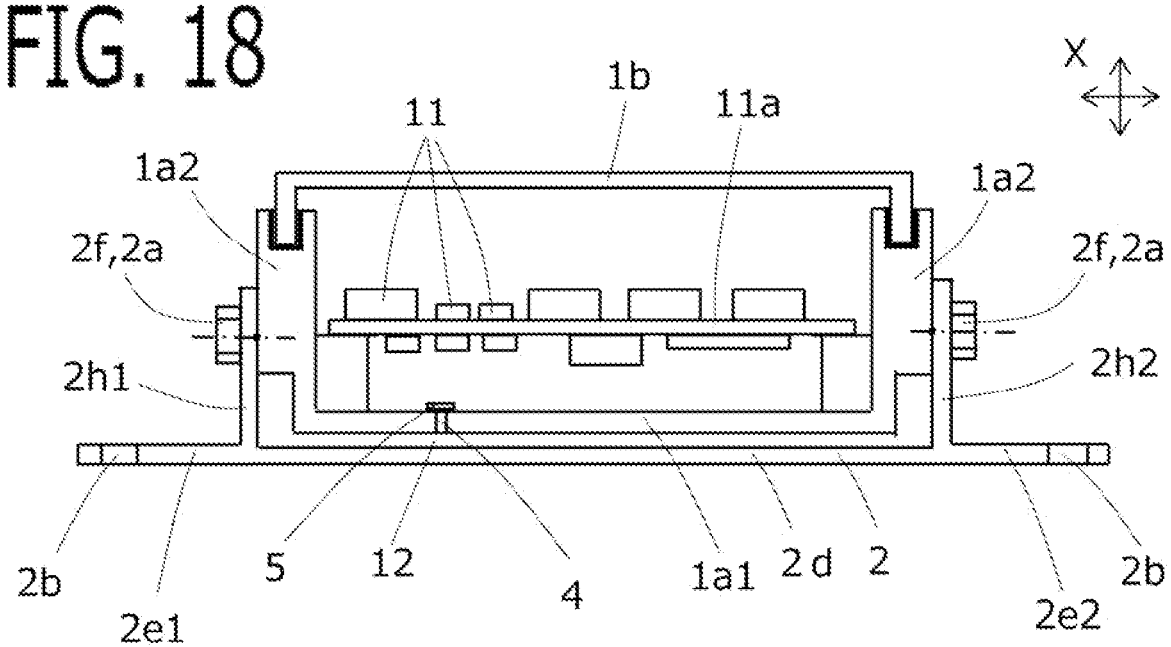
FIG. 18 is a cross-sectional view of an electric apparatus according to Embodiment 3.

Next, a second alternative example of the present embodiment will be explained. FIG. 18 is a cross-sectional view of an electric apparatus according to the second alternative example of the present embodiment; FIG. 19 is a plan view of the electric apparatus, when it is viewed from a bottom wall 1a1 side thereof. As illustrated in these drawings, the first arm portion 2e1 and the second arm portion 2e2 each extend from the case-side plate-shaped portion 2d without being bent. The bracket 2 has a plate-shaped first extending portion 2h1 that extends from the boundary portion between the first arm portion 2e1 and the case-side plate-shaped portion 2d toward the circumferential wall 1ag and a plate-shaped second extending portion 2h2 that extends from the boundary portion between the second arm portion 2e2 and the case-side plate-shaped portion 2d toward the circumferential wall 1a2. The case-fixing portions 2a for mounting the bracket 2 to the case 1 are provided in the first extending portion 2h1 and the second extending portion 2h2. The bolt 2f is inserted into a through-hole in the case-fixing portion 2a so as to be screwed to a bolt hole provided in the case 1 (the circumferential wall 1a2, in this example).

The respective lengths of the first extending portion 2h1 and the second extending portion 2h2 are adjusted so that a gap occurs between the bottom wall 1a1 of the case 1 where the ventilation hole 4 is provided and the case-side plate-shaped portion 2d of the bracket 2.

4. Embodiment 4

Next, an electric apparatus according to Embodiment 4 will be explained. The explanation for constituent parts the same as those in Embodiment 1 will be omitted. The basic configuration of the electric apparatus according to the present embodiment is the same as that according to Embodiment 1. The present embodiment is different from Embodiment 1 in that a part of the external connector 3 covers the outside of the ventilation hole 4. In the present embodiment, the bracket 2 is not provided.

Figure 23:
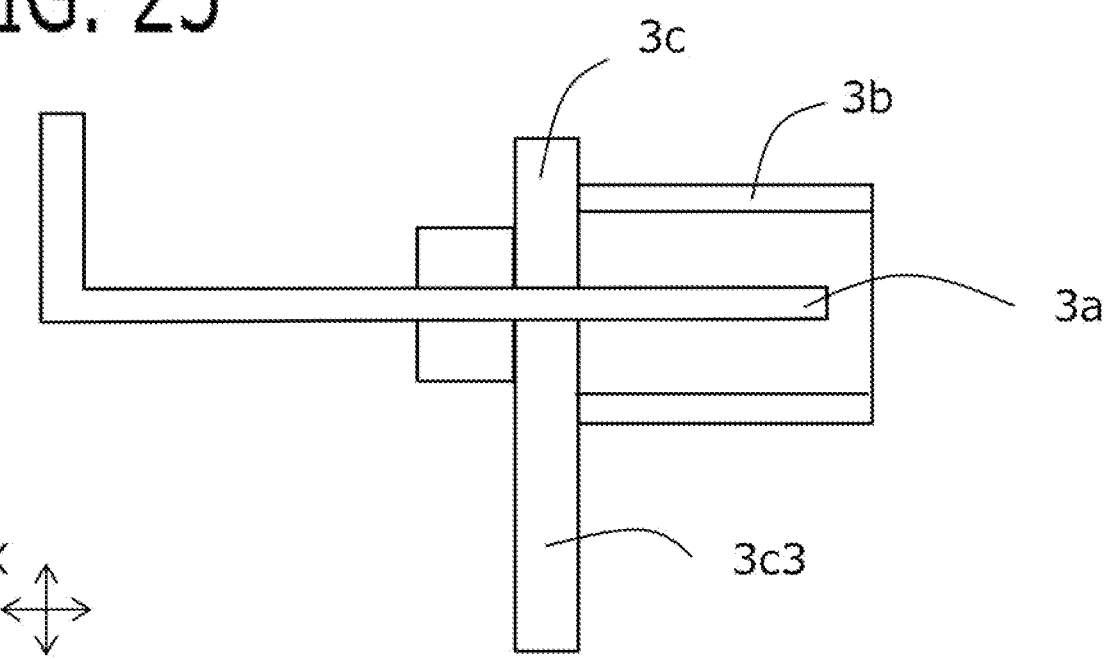
FIG. 23 is a cross-sectional view of the external connector according to Embodiment 4.

FIG. 20 is a perspective view of the electric apparatus according to the present embodiment. FIG. 21 is a cross-sectional view of the electric apparatus. FIG. 22 is a perspective view of the external connector 3; FIG. 23 is a cross-sectional view of the external connector 3.

In the present embodiment, a protective member for covering the outside of the ventilation hole 4 is a part of the external connector 3 for electrically connecting the electronic component 11 with the outside; a communication path 12 for making the outer opening portion of the ventilation hole 4 communicate with the outside is provided between the outer wall of the case 1 where the ventilation hole 4 is formed and a part of the external connector 3.

This configuration makes it possible that the external connector 3 covers the ventilation hole 4 and hence the ventilation hole 4 is protected from foreign materials such as water, dust, and flying matter; thus, for example, the ventilation hole 4 can be suppressed from being clogged or foreign materials can be suppressed from intruding into the case 1 through the ventilation hole 4. Moreover, because the communication path 12 is provided, air can be circulated between the inside and the outside of the case 1 through the ventilation hole 4 and the communication path 12; thus, against a temperature change in the gas, caused by heat generation in the electronic component 11, the gaseous pressure in the case 1 can appropriately be kept.

Moreover, the external connector 3 to be utilized for electrically connecting the electronic component 11 with the outside can also be utilized for covering the outside of the ventilation hole 4 and for providing the communication path 12. Accordingly, because no dedicated member for protecting the ventilation hole 4 needs to be provided, the number of components can be suppressed from increasing and hence the production cost can be suppressed from rising.

In the present embodiment, the ventilation hole 4 is provided in the circumferential wall lag (the circumferential wall lag at the right side in the drawing) where the external connector 3 is provided; the ventilation hole 4 penetrates the circumferential wall 1a2.

As is the case with Embodiment 1, the external connector 3 has connection terminals 3a, a housing portion 3b surrounding the periphery of the connection terminals 3a, and a flange portion 3c protruding toward the outer circumferential side of the housing portion 3b. The flange portion 3c is disposed at the outside of the outer wall (circumferential wall lag) of the case 1 so as to be attached to the outer wall. In the present embodiment, the protective member for covering the outside of the ventilation hole 4 is a part of the flange portion 3c.

In this configuration, because the outside of the ventilation hole 4 can be covered by use of the structure of the flange portion 3c provided for mounting the external connector 3 to the outer wall, the production cost of the external connector 3 can be suppressed from increasing.

The connection terminals 3a are electric conductors such as copper; four pieces of the connection terminals 3a are arranged in parallel with one another. Each of the connection terminals 3a penetrates the outer wall (circumferential wall lag) of the case 1; one end of the connection terminal 3a is connected with the electronic component 11 and the other end thereof is exposed to the outside of the case 1. The housing portion 3b is formed in the shape of a tube (rectangular tubular, in this example) and surrounds the periphery of the connection terminal 3a that is exposed to the outside of the case 1. The flange portion 3c has a rectangular-plate-shaped first flange portion 3c1 protruding from the housing portion 3b toward a first side (the upper side Y2, in this example) and a rectangular-plate-shaped second flange portion 3c2 protruding from the housing portion 3b toward a second side (the lower side Y1, in this example) opposite to the first side. A through-hole 3f to be penetrated by a screw 3d is formed in each of the first flange portion 3c1 and the second flange portion 3c2. The screw 3d is inserted into the through-hole 3f in each of the first flange portion 3c1 and the second flange portion 3c2 so as to be screwed to a screw hole provided in the outer wall (the circumferential wall lag) of the case 1. As a result, the external connector 3 is fixed to the case 1.

The flange portion 3c has a rectangular-plate-shaped flange protective portion 3c3 protruding from the housing portion 3b in a direction perpendicular to the line connecting the respective through-holes 3f of the first flange portion 3c1 and the second flange portion 3c2. The flange protective portion 3c3 covers the outside of the ventilation hole 4. The flange protective portion 3c3 is disposed in the area between the through-hole 3f of the first flange portion 3c1 and the through-hole 3f of the second flange portion 3c2. In this configuration, because the flange protective portion 3c3 can be disposed in the area between the two fixing portions of the flange portion 3c, the adhesion strength between the flange protective portion 3c3 and the outer wall (the circumferential wall lag) of the case 1 can be raised.

In the present embodiment, a groove 1c extending from the outer opening portion of the ventilation hole 4 is formed in the outer side surface of the outer wall (the bottom wall lag) of the case 1. In addition, the communication path 12 is formed in such a way that a part of the groove other than an end portion 1d (hereinafter, referred to as an opening-side end portion 1d) opposite to the outer opening portion of the ventilation hole 4 is covered with the flange portion 3c (the flange protective portion 3c3) of the external connector 3. Accordingly, the opening-side end portion 1d, of the groove 1c, that is not covered with the flange portion 3c is an opening portion 12a to the outside of the communication path 12.

This configuration makes it possible to provide the communication path 12 by use of a simple structure in which the groove 1c is formed in the outer side surface of the outer wall of the case 1 and in which a part of the groove 1c other than the opening-side end portion 1d thereof is covered with the flange portion 3c. That is to say, because it is only necessary to form a groove in the outer wall of the case 1 and to cover the groove with the flange portion 3c, the production cost can be suppressed from increasing.

A part of the outer side surface, of the outer wall (the circumferential wall lag) of the case 1, that is around the groove 1c (except the opening-side end portion 1d) abuts on the facing side (the flange protective portion 3c3) of the flange portion 3c. Therefore, the flange portion 3c covers the groove 1*c* except the opening-side end portion 1*d*. As a result, even when water splashes on the communication path 12 from two or more directions, the water can be suppressed from intruding thereinto.

When the electric apparatus is mounted to an external object, the communication path 12 (the groove 1*c* included in the communication path 12) extends from the opening portion 12*a* to the outside thereof in a direction (the direction parallel to the upper side Y2, in this example) including the component of the upper side Y2. This configuration makes it possible that foreign material such as water does not easily intrude into the communication path 12 and that even when foreign material such as water intrudes into the communication path 12, gravity discharges the foreign material from the communication path 12.

In addition, it is only necessary that the communication path 12 extends from the opening portion 12*a* thereof in a direction including the component of the upper side Y2; the communication path 12 may extend in a direction inclined from the upper side Y2 (e.g., the direction inclined as large as ±45° from the upper side Y2) within an area including the component at the upper side Y2).

In the present embodiment, when the electric apparatus is mounted to an external object, the communication path 12 (the groove 1*c* included in the communication path 12) extends from the opening portion 12*a* to the outside thereof in a direction (the direction parallel to the upper side Y2, in this example) including the component of the upper side Y2; after that, the communication path 12 is bent and then extends in the horizontal direction X or in a direction including the component of the upper side Y2 (in the horizontal direction X, in this example) up to the outer opening portion of the ventilation hole 4.

This configuration makes it possible that even when water intrudes through the opening portion 12*a* of the communication path 12, the bending portion abates the water intrusion; thus, the water can be suppressed from reaching the outer opening portion of the ventilation hole 4. That is to say, bending the communication path 12 makes it possible to raise the effect of suppressing foreign material from intruding into the ventilation hole 4. Because the communication path 12 at the inner side extends in the horizontal direction X or in a direction including the component of the upper side Y2, it is made possible that even when water intrudes into a place more inside than the bending portion, the water is suppressed from being accumulated in the inner communication path 12.

5. Embodiment 5

Next, an electric apparatus according to Embodiment 5 will be explained. The explanation for constituent parts the same as those in Embodiment 4 will be omitted. The basic configuration of the electric apparatus according to the present embodiment is the same as that according to Embodiment 1. The present embodiment is different from Embodiment 4 in that a groove included in the communication path 12 is formed not in the case 1 but in the flange portion 3*c* of the external connector 3.

Figure 24:
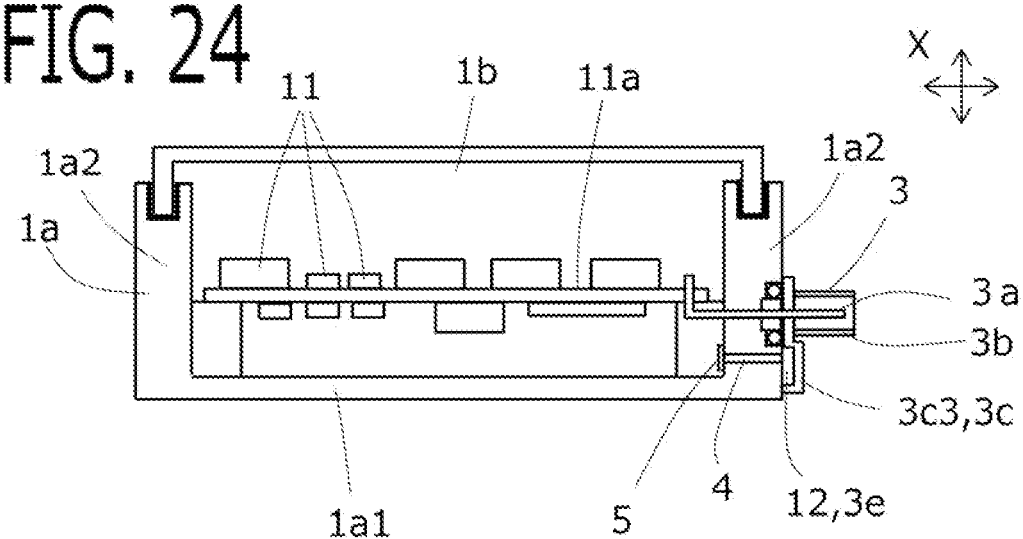
FIG. 24 is a cross-sectional view of an electric apparatus according to Embodiment 5.
Figure 25:
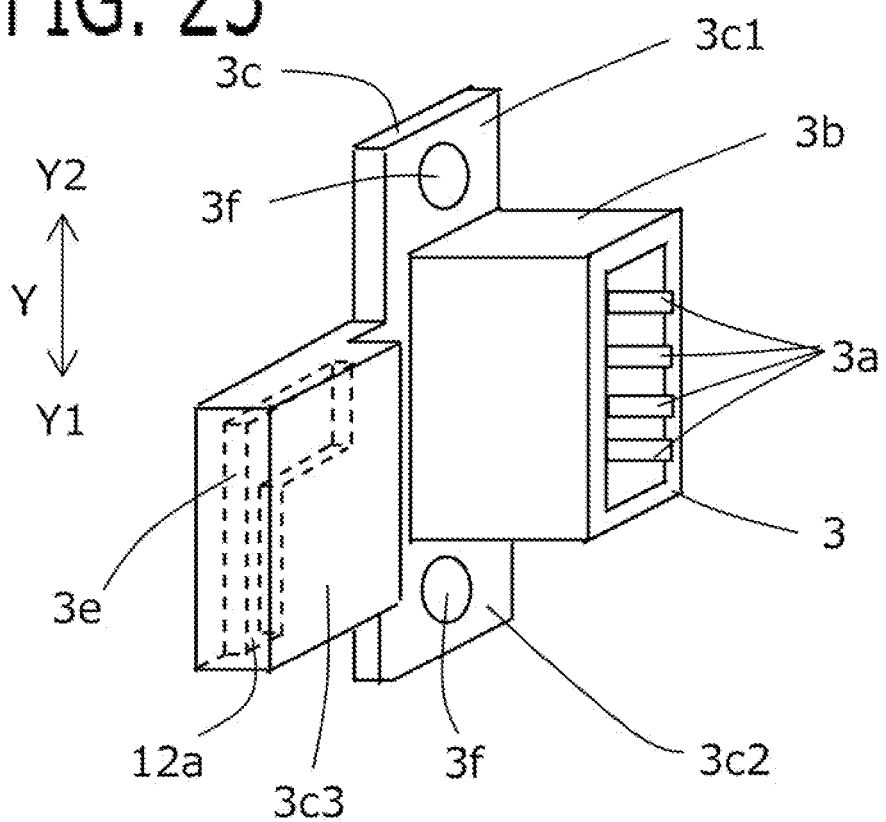
FIG. 25 is a perspective view of an external connector according to Embodiment 5.
Figure 26:
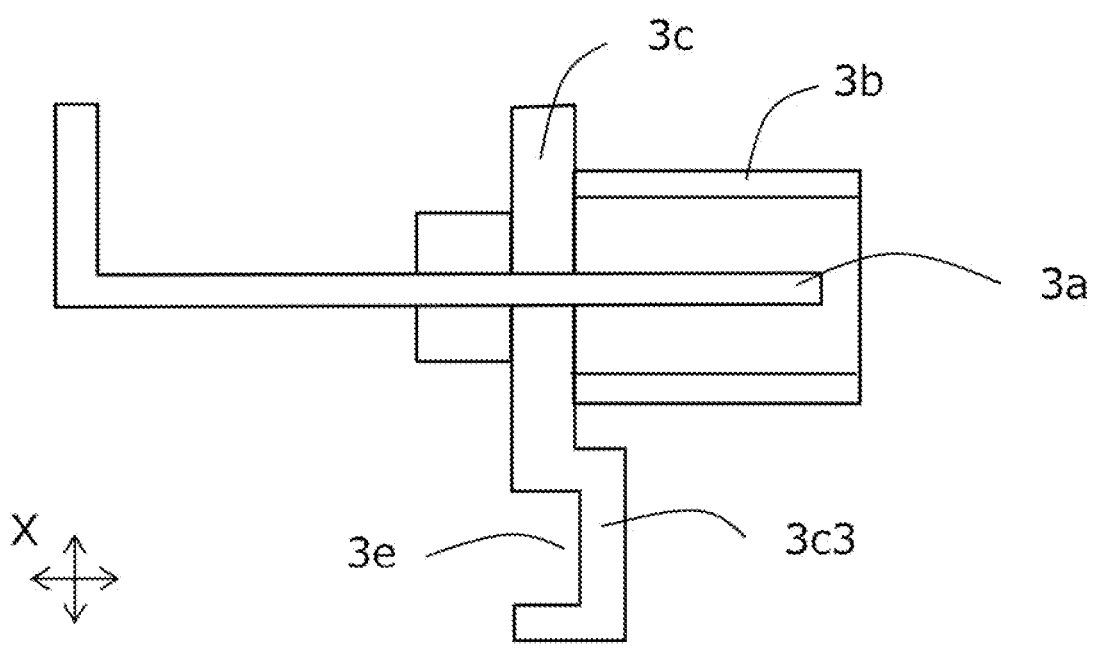
FIG. 26 is a cross-sectional view of the external connector according to Embodiment 5.

FIG. 24 is a cross-sectional view of the electric apparatus. FIG. 25 is a perspective view of the external connector 3; FIG. 26 is a cross-sectional view of the external connector 3.

In the present embodiment, in the facing side, of the flange portion 3*c* (the flange protective portion 3*c*3) of the external connector 3, that faces the ventilation hole 4, there is formed a groove 3*e* that extends from the portion facing the ventilation hole 4 to the end portion of the facing side of the flange portion 3*c*. The communication path 12 is formed in such a way that the portion of the groove 3*e* in the flange portion 3*c* is covered with the outer wall (the circumferential wall lag) of the case 1. The groove 3*e* opens toward the extending direction thereof at the end portion of the facing side of the flange portion 3*c*; this opening portion, which is not covered with the outer wall (the circumferential wall lag) of the case 1, is the opening portion 12*a* to the outside of the communication path 12.

This configuration makes it possible to provide the communication path 12 by use of a simple structure in which the groove 3*e* is formed in the facing side of the flange portion 3*c* of the external connector 3 and in which the outer wall (the bottom wall 1*a*1) of the case 1 is covered with the flange portion 3*c*. That is to say, because it is only necessary to form the groove 3*e* in the flange portion 3*c*, the production cost can be suppressed from increasing.

In the present embodiment, the thickness of the flange protective portion 3*c*3 where the groove 3*e* is formed is larger than that of each of the other flange portions (the first flange portion 3*c*1 and the second flange portion 3*c*2), so that the depth of the groove 3*e* can appropriately be set.

Also in the present embodiment, when the electric apparatus is mounted to an external object, the communication path 12 (in this example, the groove 3*e* included in the communication path 12) extends from the opening portion 12*a* to the outside thereof in a direction (the direction parallel to the upper side Y2, in this example) including the component of the upper side Y2.

In addition, when the electric apparatus is mounted to an external object, the communication path 12 (the groove 3*e* included in the communication path 12) extends from the opening portion 12*a* to the outside thereof in a direction (the direction parallel to the upper side Y2, in this example) including the component of the upper side Y2; after that, the communication path 12 is bent and then extends in the horizontal direction X or in a direction including the component of the upper side Y2 (in the horizontal direction X, in this example) up to the outer opening portion of the ventilation hole 4.

Other Embodiments

Lastly, other embodiments of the present disclosure will be explained. Each of the configurations of embodiments to be explained below is not limited to be separately utilized but can be utilized in combination with the configurations of other embodiments as long as no discrepancy occurs.

Figure 27:
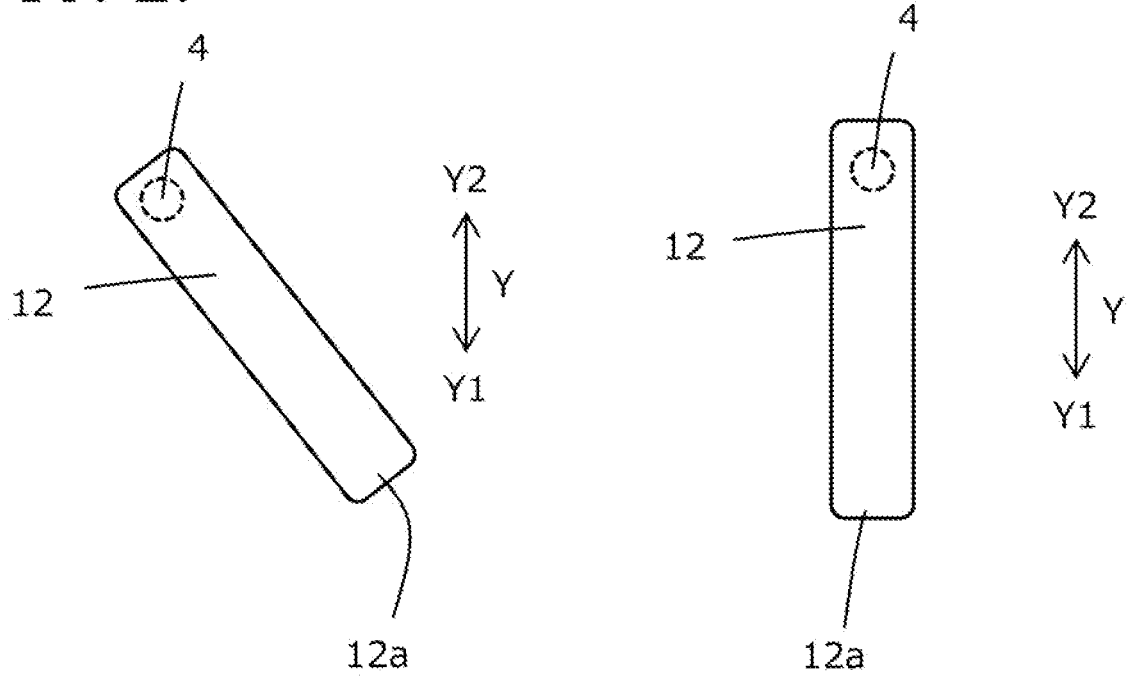
FIG. 27 is a set of schematic views for explaining the shape of a communication path according to another embodiment.

(1) In each drawing in the foregoing embodiments 1, 2, 4, and 5, there has been explained, as an example, the case where after extending from the opening portion 12*a* to the outside thereof in a direction parallel to the upper side Y2, the communication path 12 is bent and then extends in the horizontal direction X up to the outer opening portion of the ventilation hole 4. However, embodiments of the present disclosure are not limited to the foregoing case. That is to say, it is only necessary that when the electric apparatus is mounted to an external object, the communication path 12 extends from the opening portion 12*a* to the outside thereof in a direction including the component of the upper side Y2. For example, as illustrated in FIG. 27, it may be allowed that the communication path 12 extends from the opening portion 12*a* thereof in a direction inclined from the upper side Y2 within an area having the component of the upper side Y2. Moreover, as illustrated in FIG. 27, it may be allowed that no bending portion is provided in the communication path 12.

Figure 28:
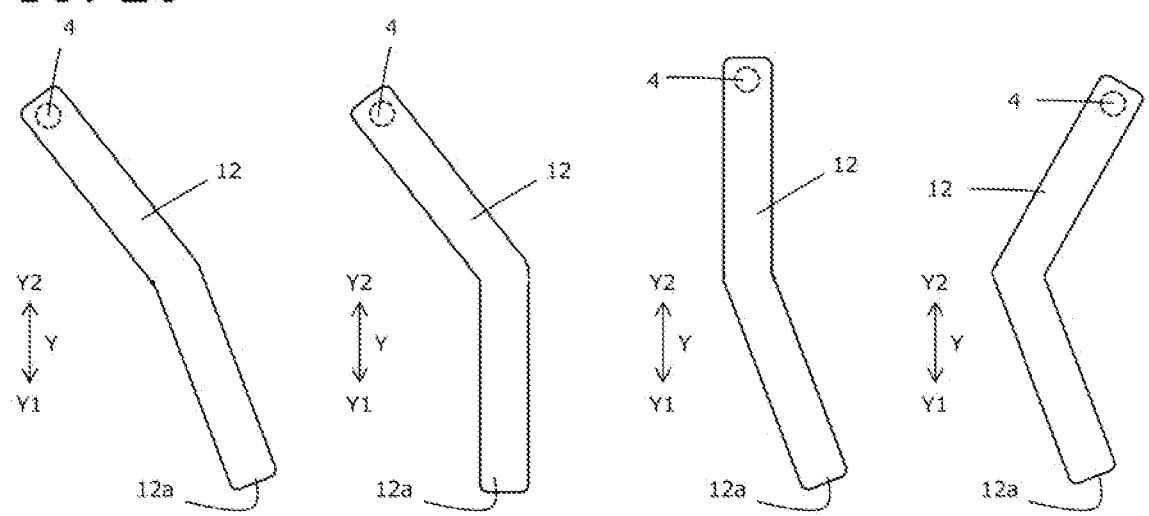
FIG. 28 is a set of schematic views for explaining the shape of a communication path according to another embodiment.

In addition, it is only necessary that when the electric apparatus is mounted to an external object, after extending from the opening portion 12a to the outside thereof in a direction including the component of the upper side Y2, the communication path 12 is bent and then extends in the horizontal direction X or in a direction including the component of the upper side Y2 up to the outer opening portion of the ventilation hole 4. For example, as illustrated in FIG. 28, it may be allowed that after extending from the opening portion 12a thereof in a direction inclined from the upper side Y2 within an area including the component of the upper side Y2, the communication path 12 is bent and then extends in a direction inclined from the upper side Y2 within an area including the component at the upper side Y2 up to the outer opening portion of the ventilation hole 4. Moreover, it may be allowed that the communication path 12 at the inner side extends in a direction parallel to the upper side Y2. It may be allowed that the respective inclination directions of the communication path 12 at the opening portion 12a side and the communication path 12 at the inner side are different from each other.

Figure 29:
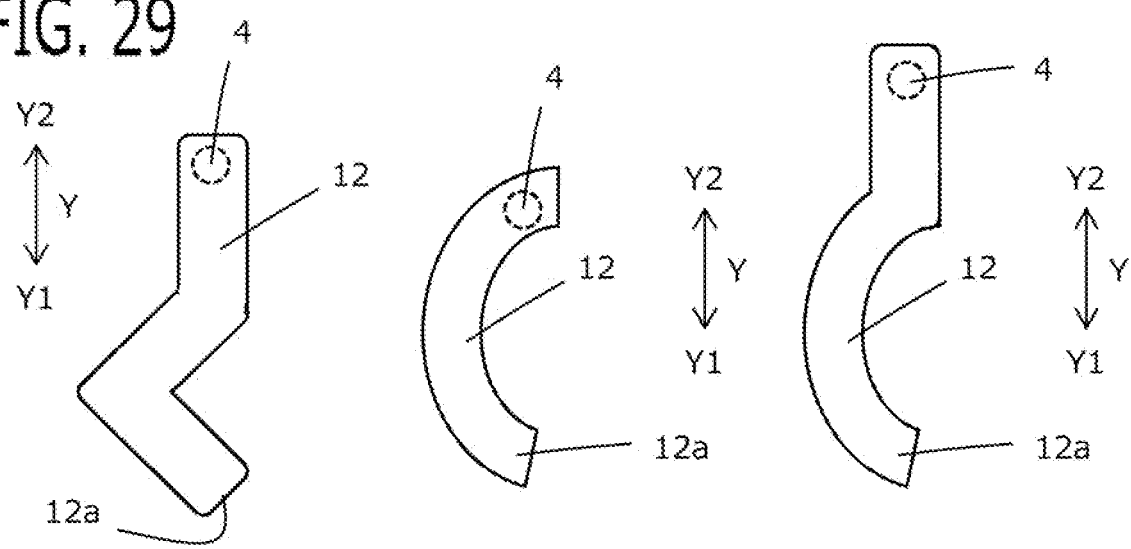
FIG. 29 is a set of schematic views for explaining the shape of a communication path according to another embodiment.

It may be allowed that the communication path 12 is bent in an arbitrary shape. For example, as illustrated in FIG. 29, the communication path 12 is bent in two or more steps, in a continuous manner, or in a combination of a continuous bending portion and a straight-line portion.

Figure 30:
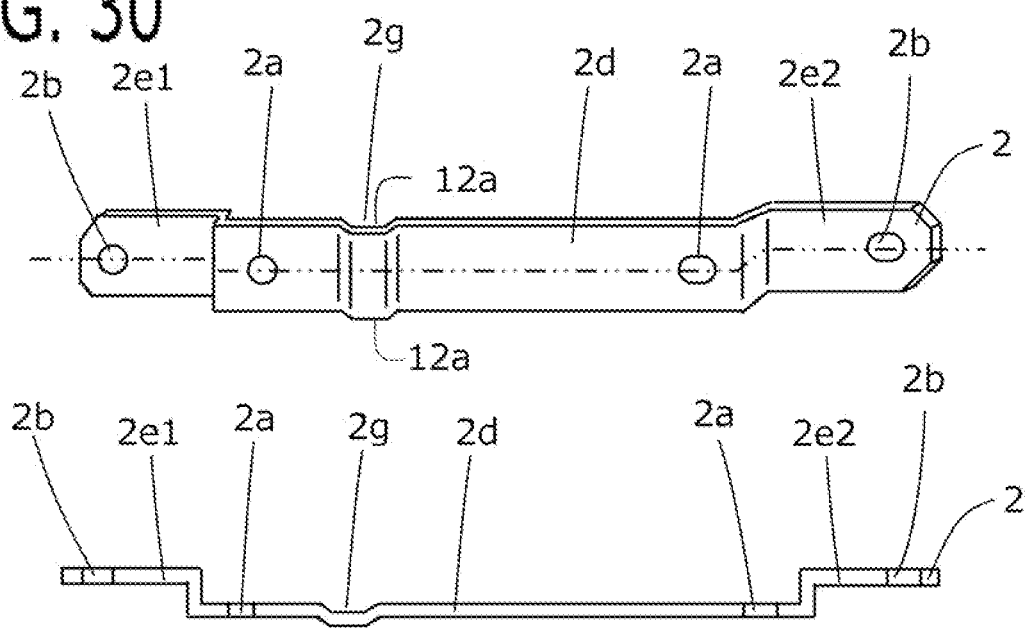
FIG. 30 is a set of a perspective view and a cross-sectional view of a bracket in a first example of an electric apparatus according to another embodiment.
Figure 31:
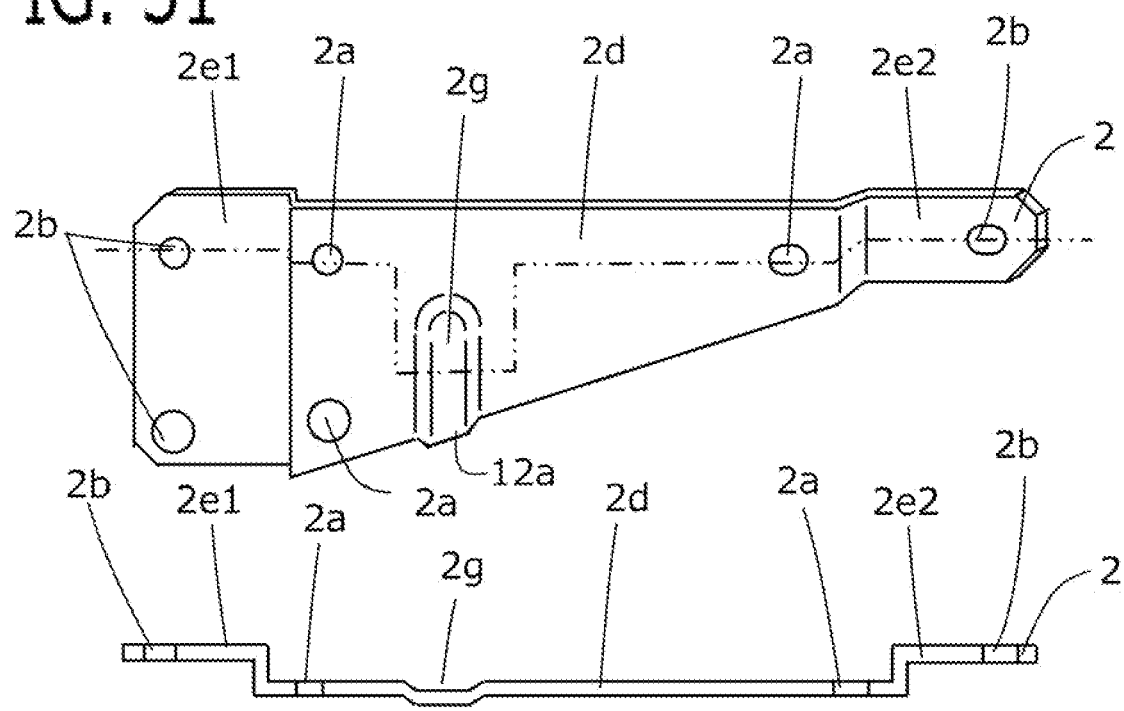
FIG. 31 is a set of a perspective view and a cross-sectional view of a bracket in a second example of the electric apparatus according to another embodiment.

Moreover, it may be allowed that the groove 2g is formed in the case-side plate-shaped portion 2d of the bracket 2 in the shape as illustrated in each of FIG. 30 that shows a set of a perspective view and a cross-sectional view, taken along the double-dot chain line, of the bracket 2 in the first example of the electric apparatus and FIG. 31 that shows a set of a perspective view and a cross-sectional view, taken along the double-dot chain line, of the bracket 2 in the second example of the electric apparatus.

(2) In each of the foregoing embodiments 1 and 2, there has been explained, as an example, the case where the ventilation hole 4 is disposed in an area at the inside of the three fixing positions (the case-fixing portions 2a). However, it may be allowed that in the case where three or more fixing positions (the case-fixing portions 2a) are provided, the ventilation hole 4 is disposed in an area at the inside of the three or more fixing positions.

(3) In each of the foregoing embodiments 1 and 2, there has been explained, as an example, the case where the electric apparatus has both the bracket 2 and the external connector 3; in the foregoing embodiment 3, there has been explained, as an example, the case where the electric apparatus has the bracket 2 but none of the external connector 3; in each of the foregoing embodiments 4 and 5, there has been explained, as an example, the case where the electric apparatus has the external connector 3 but none of the bracket 2. However, in the case where the protective member is a part of the bracket 2, it is only necessary that the electric apparatus has the bracket 2 at least; it does not matter whether or not the electric apparatus has the external connector 3. In the case where the protective member is a part of the external connector 3, it is only necessary that the electric apparatus has the external connector 3 at least; it does not matter whether or not the electric apparatus has the bracket 2.

Figure 32:
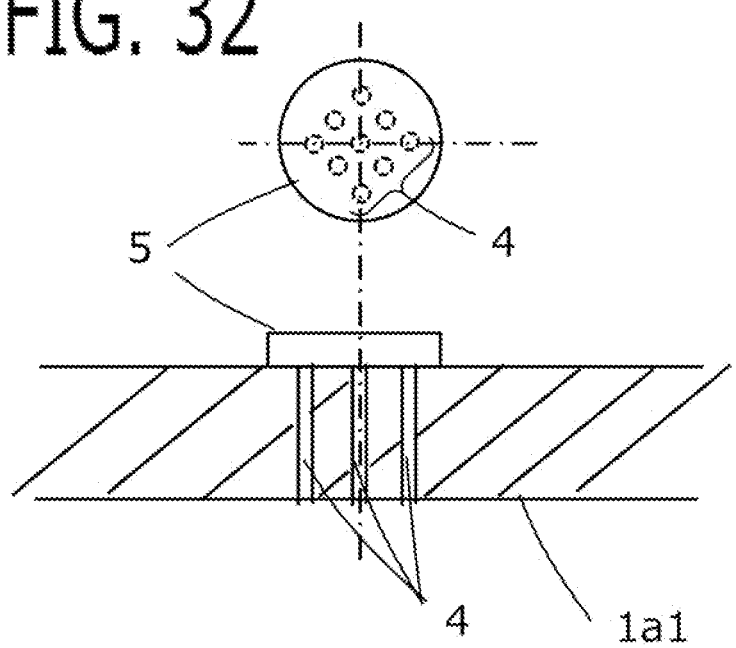
FIG. 32 is a partial plan view and a partial cross-sectional view of a ventilation hole according to another embodiment.

(4) In each of the foregoing embodiments 1, 2, 4, and 5, there has been explained, as an example, the case where as illustrated in FIG. 12, one piece of the ventilation hole 4 is provided in the outer wall of the case 1. However, it may be allowed that as the partial plan view and the cross-sectional view illustrated in each of FIGS. 32 and 33, two or more pieces of the ventilation holes 4 are provided in the outer wall of the case 1. Provision of the two or more pieces of the ventilation holes 4 makes it possible to raise the ventilation efficiency and to prevent the ventilation hole from being clogged. Moreover, it may be allowed that the respective inner opening portions of the two or more pieces of the ventilation holes 4 are covered with one piece of the waterproof ventilation filter 5.

(5) In each of the foregoing embodiments 1 and 2, there has been explained, as an example, the case where the area that is at the inside of the three fixing positions (case-fixing portions 2a) of the bracket 2 (case-side plate-shaped portion 2d) and in which the ventilation hole 4 is disposed is formed in the shape of a plate. However, it may be allowed that as FIG. 34 illustrates the plan view of the electric apparatus at a time when it is viewed from the bottom wall 1a1 side, a punched portion 2j where the member is punched is provided in the area that is at the inside of the three fixing positions (case-fixing portions 2a) of the bracket (case-side plate-shaped portion 2d) but is other than the ventilation hole 4 and the communication path 12. Provision of the punched portion 2j makes it possible to save the weight of the apparatus.

(6) In each of the foregoing embodiments, there has been explained, as an example, the case where the electric apparatus is a vehicle radar. However, it may be allowed that the electric apparatus is any one of various kinds of electric apparatuses, other than a vehicle radar, that can be exposed to foreign materials such as water, dust, and flying matter.

Although the present application is described above in terms of various exemplary embodiments and implementations, it should be understood that the various features, aspects and functions described in one or more of the individual embodiments are not limited in their applicability to the particular embodiment with which they are described, but instead can be applied, alone or in various combinations to one or more of the embodiments. Therefore, an infinite number of unexemplified variant examples are conceivable within the range of the technology disclosed in the present disclosure. For example, there are included the case where at least one constituent element is modified, added, or omitted and the case where at least one constituent element is extracted and then combined with constituent elements of other embodiments.

REFERENCE SIGNS LIST

1: case, 1c: groove in outer wall, 2: bracket, 2g: groove in bracket, 3: external connector, 3a: connection terminal, 3b: housing portion, 3c: flange portion, 3e: groove in flange portion, 4: ventilation hole, 5: waterproof ventilation filter, 11: electronic component, 12: communication path, 12a: opening portion of communication path, Y2: upper side

The invention claimed is:
1. An electric apparatus comprising:
an electronic component;
a case that has an outer wall for containing the electronic component therein and is provided with a ventilation hole penetrating the outer wall;
a protective member for covering outside of the ventilation hole; and one or both of a bracket for mounting the case to an external object and an external connector for electrically connecting the electronic component with outside, wherein the protective member is a part of the bracket or a part of the external connector, wherein a communication path for making an outer opening portion of the ventilation hole communicate with outside is provided between the outer wall and the protective member, and wherein when the electric apparatus is mounted to an external object, after extending from the opening portion to outside thereof in a direction including a component of the upper side, the communication path is bent and then extends in a horizontal direction or in a direction including a component of the upper side up to the outer opening portion of the ventilation hole.

2. The electric apparatus according to claim 1,
wherein the external connector includes
a connection terminal,
a housing portion surrounding a periphery of the connection terminal, and
a flange portion that protrudes toward an outer circumferential side of the housing portion, that is disposed at outside of the outer wall, and that is mounted to the outer wall, and
wherein the protective member is a part of the flange portion.

3. The electric apparatus according to claim 1, wherein when the electric apparatus is mounted to an external object, the communication path extends from an opening portion to outside thereof in a direction including a component of an upper side.

4. The electric apparatus according to claim 1, wherein the communication path is bent.

5. The electric apparatus according to claim 1,
wherein the protective member is fixed to the case at two fixing positions, and
wherein the ventilation hole and the communication path are arranged in an area connecting the two fixing positions.

6. The electric apparatus according to claim 1,
wherein the protective member is fixed to the case at three or more fixing positions, and
wherein the ventilation hole and the communication path are arranged in an area within the three or more fixing positions.

7. The electric apparatus according to claim 1,
wherein the protective member is the part of the bracket, and
wherein a gap is provided between the outer wall where the ventilation hole is provided and a part of the bracket that works as the protective member, and the gap forms the communication path.

8. The electric apparatus according to claim 1, wherein a waterproof ventilation filter for covering an inner opening portion of the ventilation hole is provided.

9. An electric apparatus comprising:
an electronic component;
a case that has an outer wall for containing the electronic component therein and is provided with a ventilation hole penetrating the outer wall;
a protective member for covering outside of the ventilation hole; and
one or both of a bracket for mounting the case to an external object and an external connector for electrically connecting the electronic component with outside,
wherein the protective member is a part of the bracket or a part of the external connector,
wherein a communication path for making an outer opening portion of the ventilation hole communicate with outside is provided between the outer wall and the protective member,
  wherein a groove extending from the outer opening portion of the ventilation hole is formed in an outer side surface of the outer wall, and
  wherein the communication path is formed in such a way that a part of the groove other than an end portion opposite to the outer opening portion of the ventilation hole is covered with the protective member.

10. An electric apparatus comprising:
an electronic component;
a case that has an outer wall for containing the electronic component therein and is provided with a ventilation hole penetrating the outer wall;
a protective member for covering outside of the ventilation hole; and
one or both of a bracket for mounting the case to an external object and an external connector for electrically connecting the electronic component with outside,
wherein the protective member is a part of the bracket or a part of the external connector,
wherein a communication path for making an outer opening portion of the ventilation hole communicate with outside is provided between the outer wall and the protective member,
  wherein in a facing side, of the protective member, that faces the ventilation hole, there is formed a groove that extends from a portion facing the ventilation hole to an end portion of the facing side, and
  wherein the communication path is formed in such a way that a part of the protective member that is the groove is covered with the outer wall.

* * * * *